(12) United States Patent
Suzuki et al.

(10) Patent No.: US 8,847,229 B2
(45) Date of Patent: *Sep. 30, 2014

(54) FLEXIBLE SEMICONDUCTOR DEVICE, METHOD FOR MANUFACTURING THE SAME, IMAGE DISPLAY DEVICE USING THE SAME AND METHOD FOR MANUFACTURING THE IMAGE DISPLAY DEVICE

(75) Inventors: Takeshi Suzuki, Osaka (JP); Koichi Hirano, Osaka (JP); Shinobu Masuda, Osaka (JP)

(73) Assignee: Panasonic Corporation, Osaka (JP)

( * ) Notice: Subject to any disclaimer, the term of this patent is extended or adjusted under 35 U.S.C. 154(b) by 3 days.

This patent is subject to a terminal disclaimer.

(21) Appl. No.: 13/820,859

(22) PCT Filed: Feb. 21, 2012

(86) PCT No.: PCT/JP2012/001152
§ 371 (c)(1),
(2), (4) Date: Mar. 5, 2013

(87) PCT Pub. No.: WO2012/127780
PCT Pub. Date: Sep. 27, 2012

(65) Prior Publication Data
US 2013/0161628 A1  Jun. 27, 2013

(30) Foreign Application Priority Data
Mar. 24, 2011  (JP) .................... 2011-066143

(51) Int. Cl.
*H01L 29/04* (2006.01)
*H01L 21/027* (2006.01)
*H01L 29/66* (2006.01)
*H01L 27/12* (2006.01)
*H01L 29/786* (2006.01)
*H01L 33/08* (2010.01)
*H01L 23/544* (2006.01)

(52) U.S. Cl.
CPC .......... *H01L 29/786* (2013.01); *H01L 21/0274* (2013.01); *H01L 2223/54426* (2013.01); *H01L 29/66742* (2013.01); *H01L 27/124* (2013.01); *H01L 29/78603* (2013.01); *H01L 29/78606* (2013.01); *H01L 33/08* (2013.01); *H01L 23/544* (2013.01); *H01L 2223/5442* (2013.01); *H01L 29/78693* (2013.01)
USPC .......................................................... 257/59

(58) Field of Classification Search
CPC ..................... H01L 21/0274; H01L 2223/544; H01L 223/54426; H01L 2251/5538; H01L 27/3241; H01L 27/1251; H01L 27/32; H01L 27/3281; H01L 29/3244; H01L 29/66742; H01L 29/4908; H01L 29/7842; H01L 2924/13069
USPC .............. 438/149–167; 257/49, 72, E51.005, 257/E29.151, 59
See application file for complete search history.

(56) References Cited

U.S. PATENT DOCUMENTS

| | | | |
|---|---|---|---|
| 7,288,792 B2 | 10/2007 | Yudasaka | |
| 2010/0032674 A1* | 2/2010 | Noda et al. | 257/59 |
| 2010/0181558 A1* | 7/2010 | Yamashita et al. | 257/40 |
| 2010/0276691 A1* | 11/2010 | Ichiryu et al. | 257/57 |
| 2011/0204367 A1* | 8/2011 | Nakatani et al. | 257/59 |

FOREIGN PATENT DOCUMENTS

| | | |
|---|---|---|
| JP | 7-302881 | 11/1995 |
| JP | 2000-305109 | 11/2000 |
| JP | 2005-236186 | 9/2005 |
| JP | 2007-067263 | 3/2007 |
| JP | 2010-145772 | 7/2010 |
| JP | 2010-238873 | 10/2010 |

OTHER PUBLICATIONS

International Search Report issued Apr. 17, 2012 in International (PCT) Application No. PCT/JP2012/001152.

International Preliminary Report on Patentability and Written Opinion of the International Searching Authority mailed Oct. 3, 2013 in International (PCT) Application No. PCT/JP2012/001152.

* cited by examiner

*Primary Examiner* — Brook Kebede
(74) *Attorney, Agent, or Firm* — Wenderoth, Lind & Ponack, L.L.P.

(57) ABSTRACT

There is provided a method for manufacturing a flexible semiconductor device. The manufacturing method of the flexible semiconductor device of the present invention comprising the steps of: forming a gate electrode; forming a gate insulating film so that the gate insulating film contacts with the gate electrode; forming a semiconductor layer on the gate insulating film such that the semiconductor layer is opposed to the gate electrode; forming source and drain electrodes so that the source and drain electrodes contact with the semiconductor layer; forming a flexible film layer so that the flexible film layer covers the semiconductor layer and the source and drain electrodes; forming vias in the flexible film layer; forming a first metal layer by disposing a metal foil onto the flexible film layer, and thereby a semiconductor device precursor is provided; and subjecting the first metal layer to a processing treatment to form a wiring from a part of the first metal layer, wherein, in the step of the processing treatment of the first metal layer, the wiring is formed in a predetermined position by using at least one of the vias as an alignment marker.

26 Claims, 25 Drawing Sheets

Fig. 5
(a)
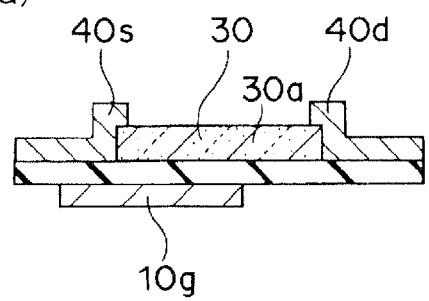 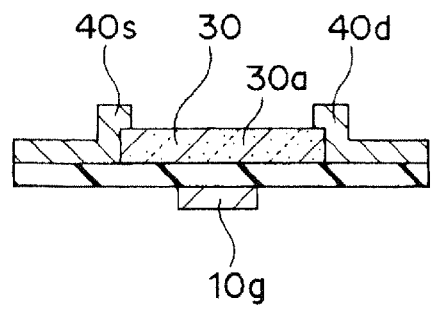
(b)
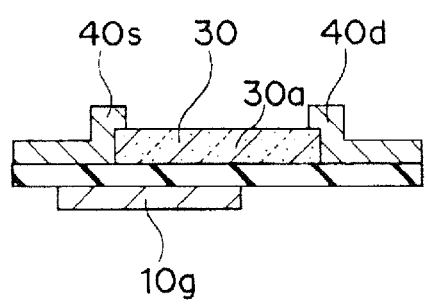 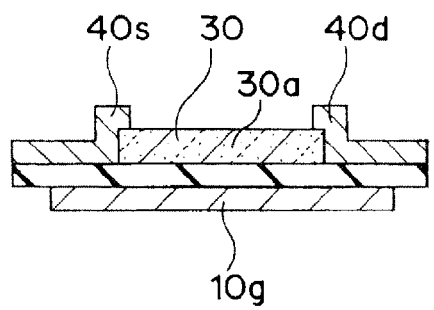
(c)
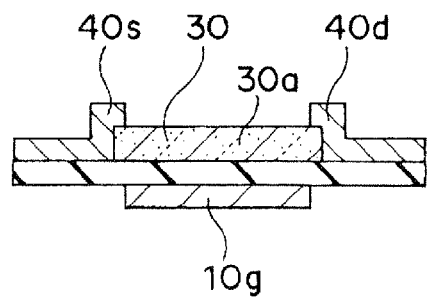

Fig. 7
(a) 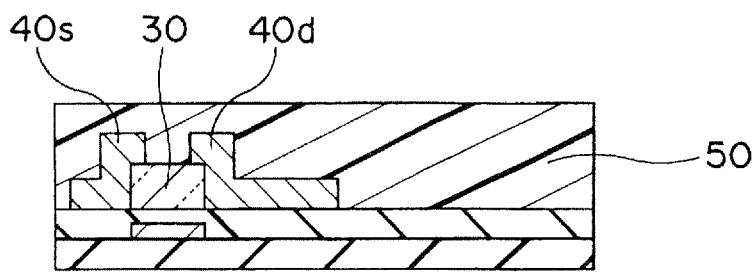
(b) 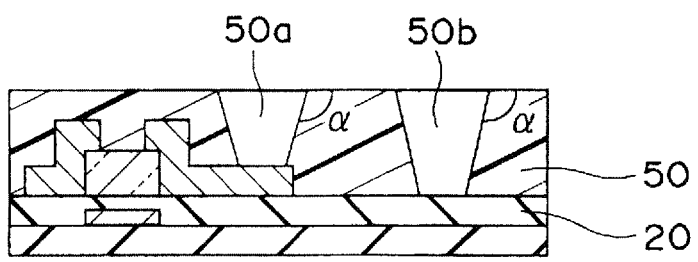
(c) 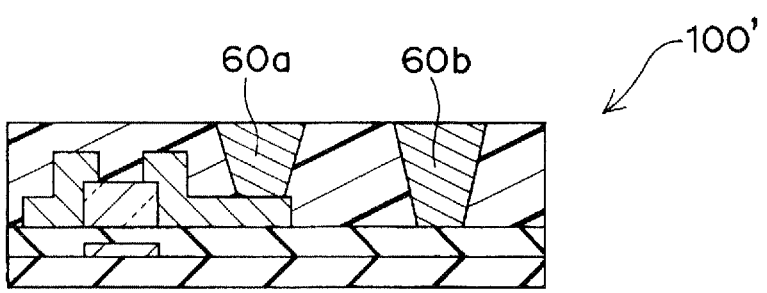
(d) 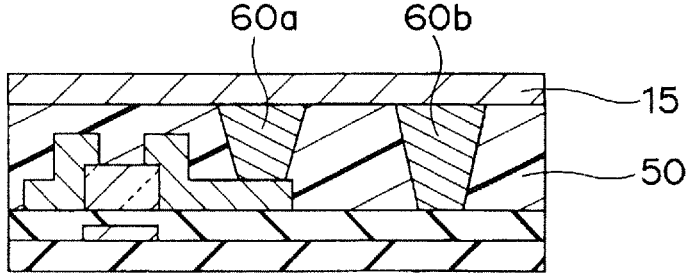

Fig. 8
(a)
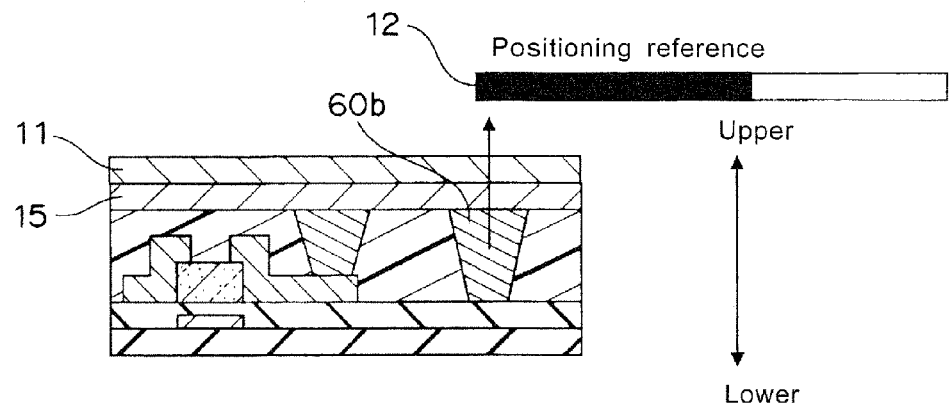
(b) Light-exposure and developing treatments
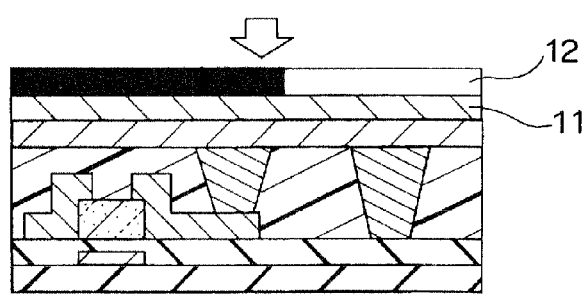
(c)
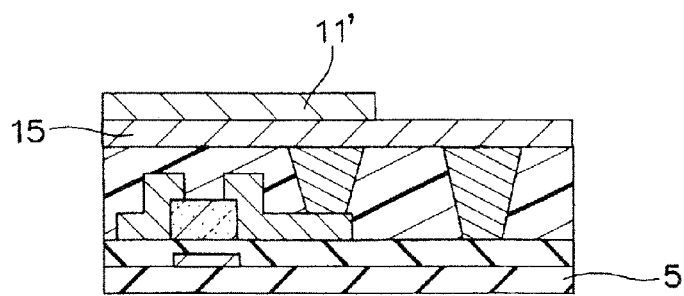

Fig. 10
Direct Light-Exposure
Formation of resist film
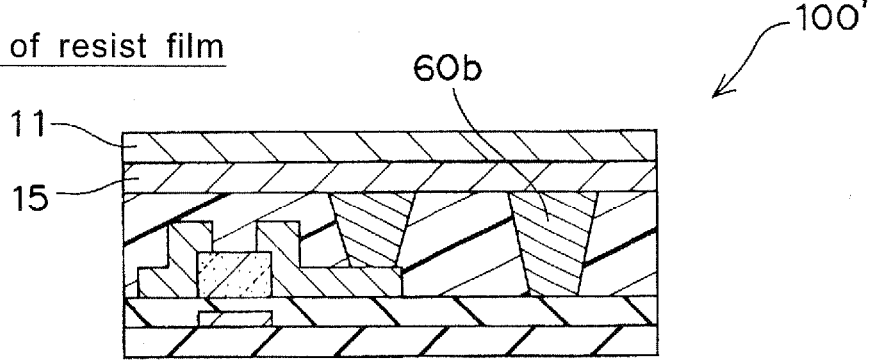
Direct light-exposure
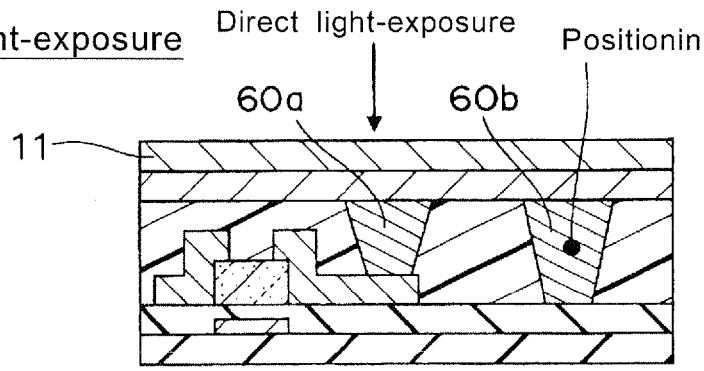
Development
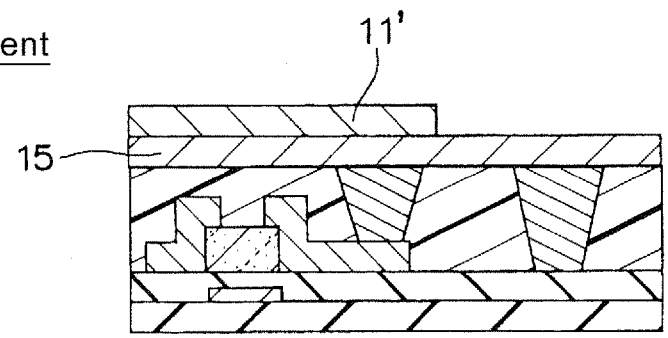

Fig. 11
(a)
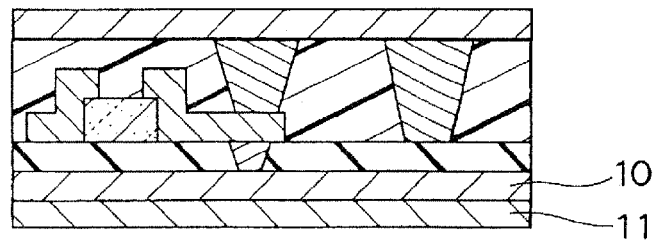
(b)
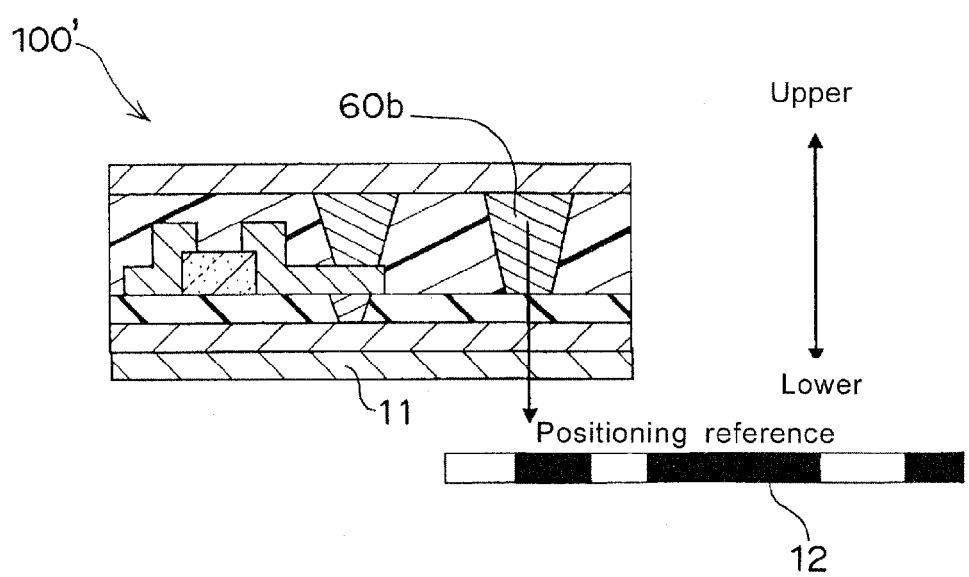
(c)
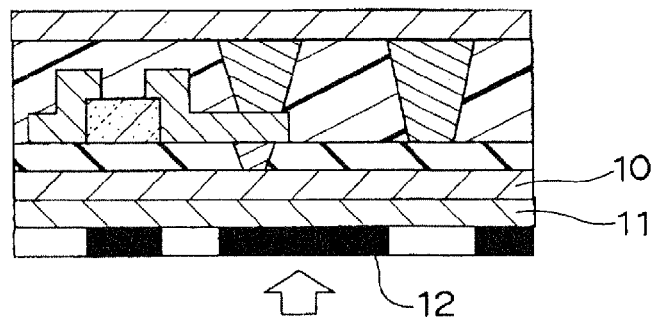
Light-exposure and developing treatments Fig. 12
(a)
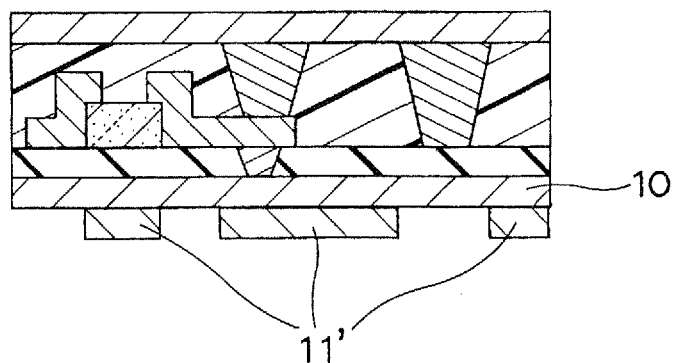
(b)
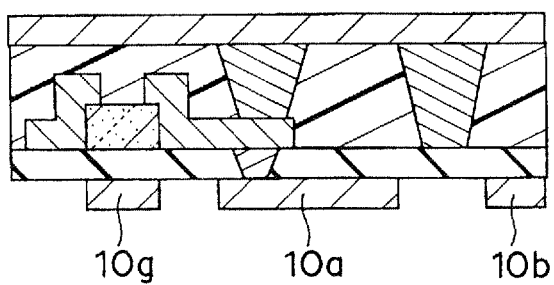

Fig. 13
(a)
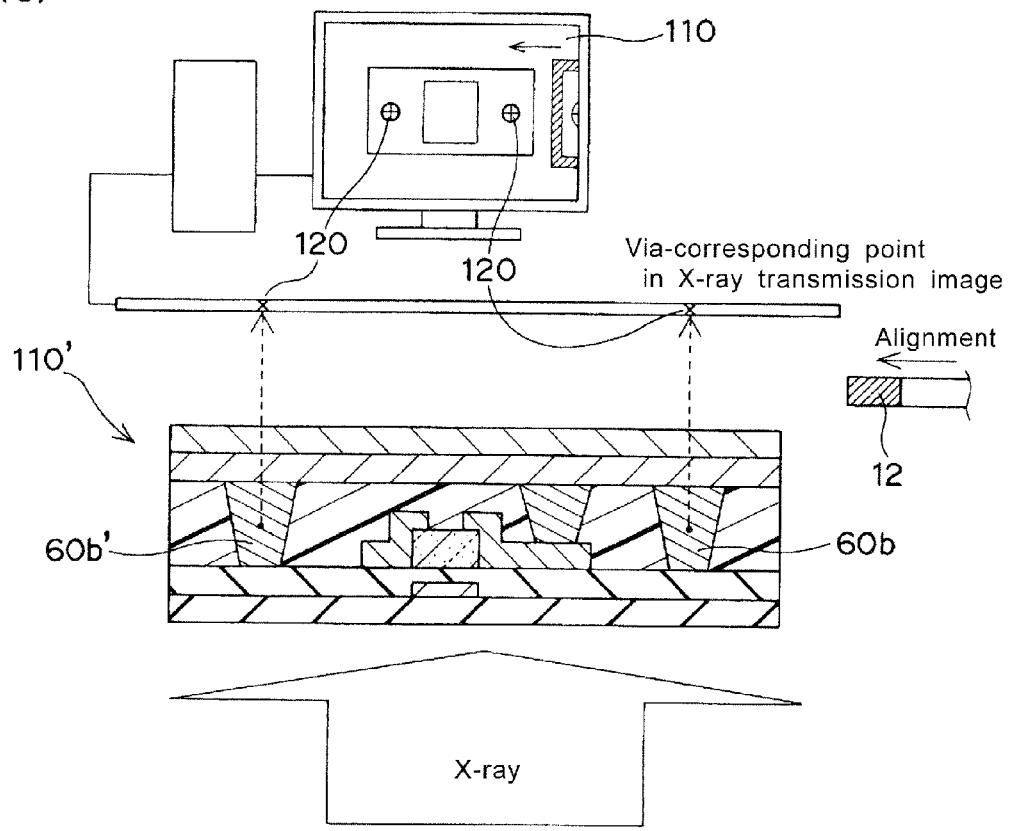
(b)
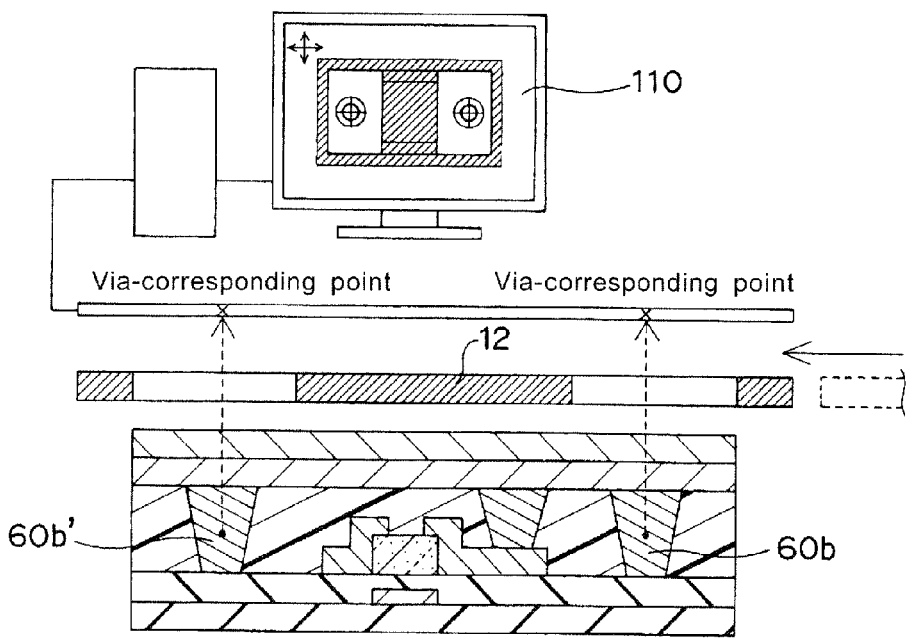

Fig. 14
(a)
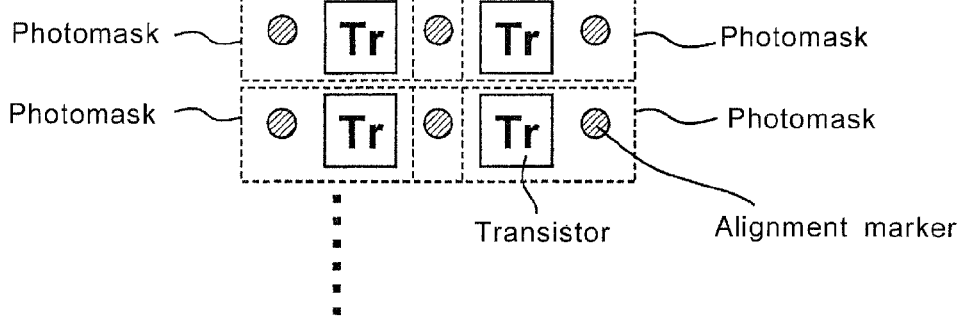
(b)
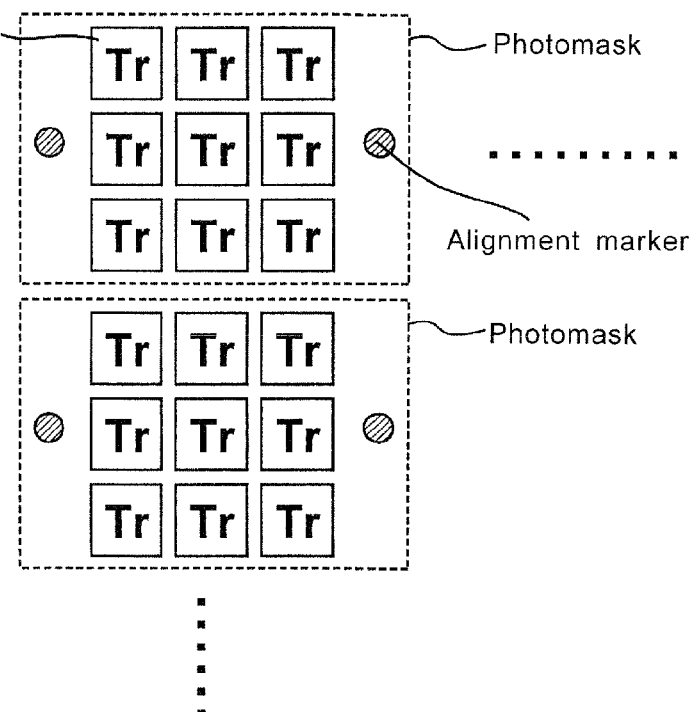
(c)
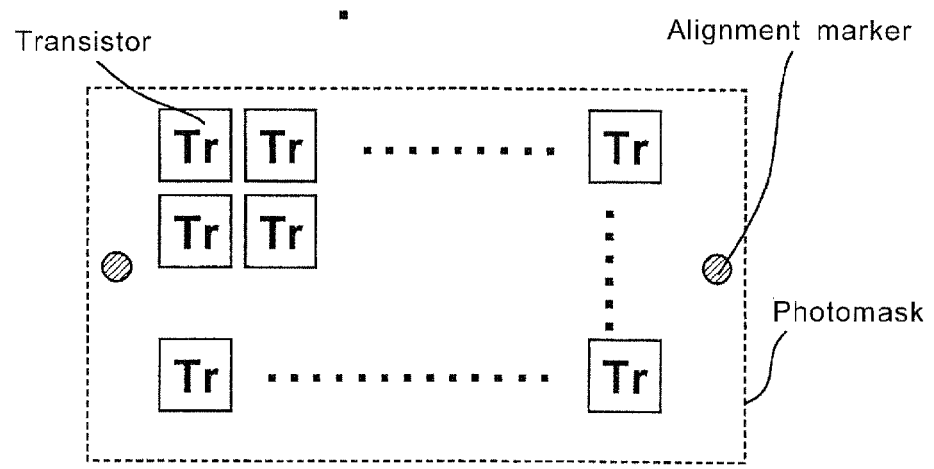

Fig. 15
(a)
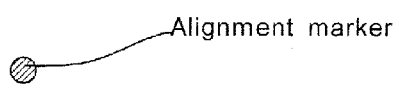
Alignment marker
(b)
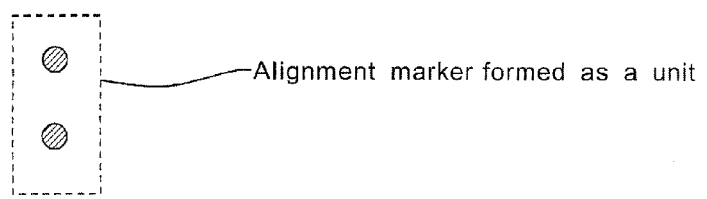
Alignment marker formed as a unit
(c)
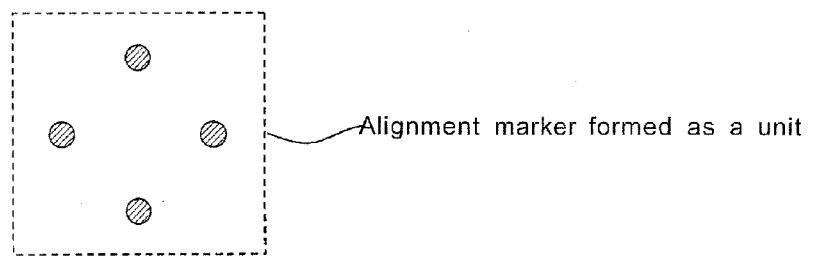
Alignment marker formed as a unit
(d)
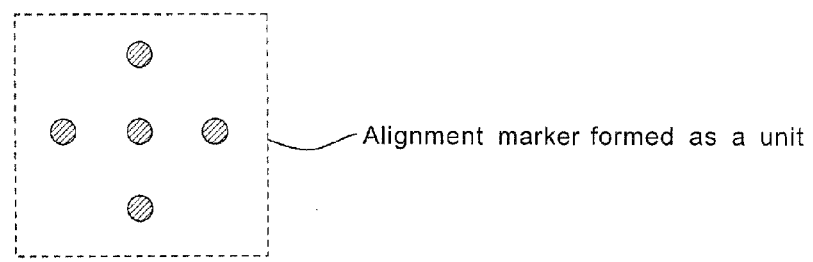
Alignment marker formed as a unit Fig. 16
(a)
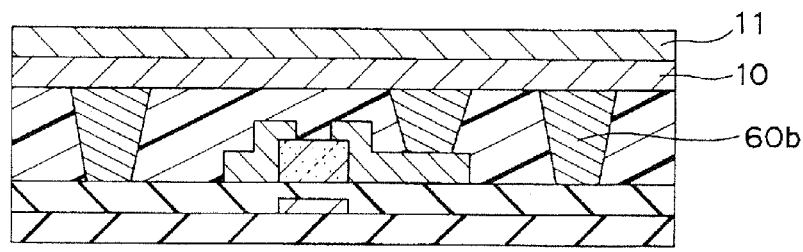
(b)
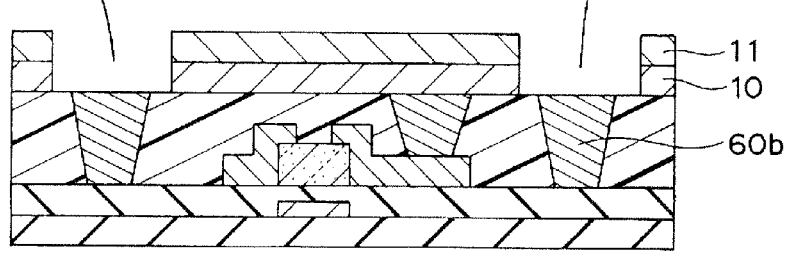
(c)
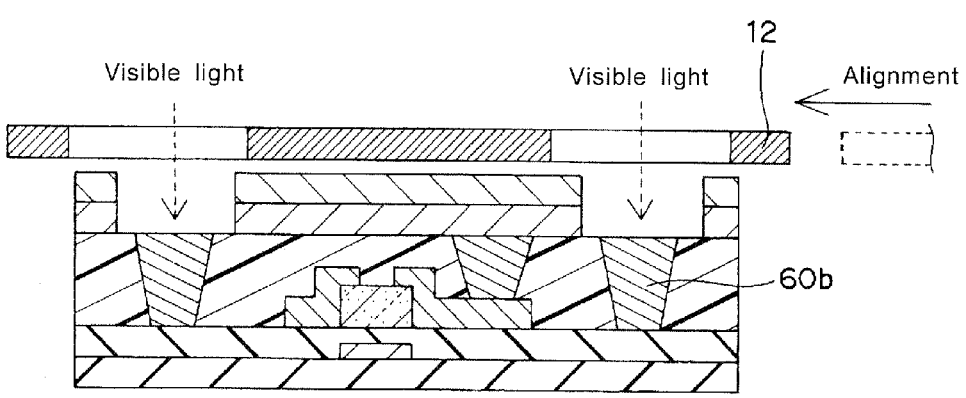

Fig. 18
(a)
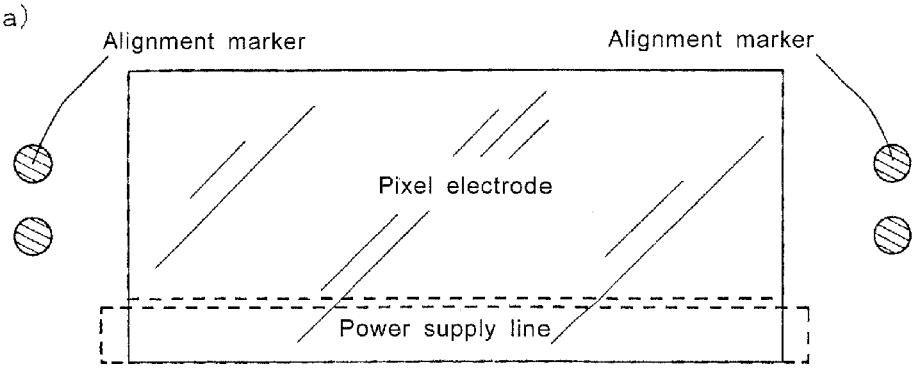
(b)
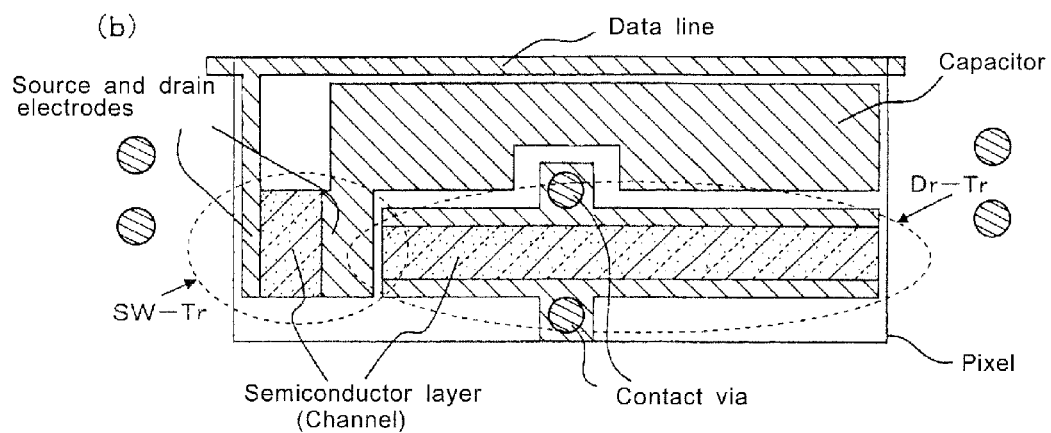
(c)
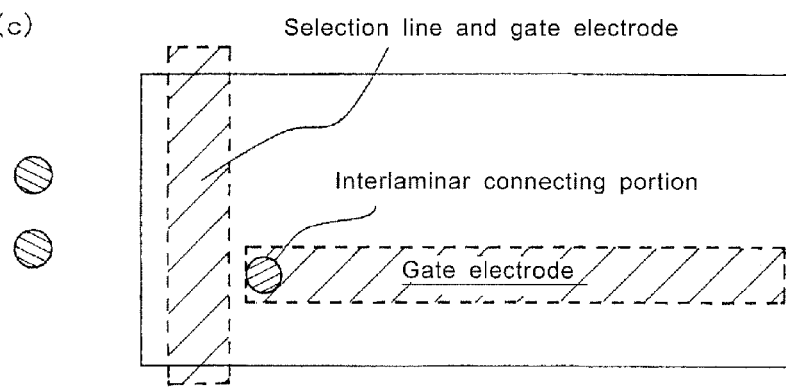

Fig. 22
(a) 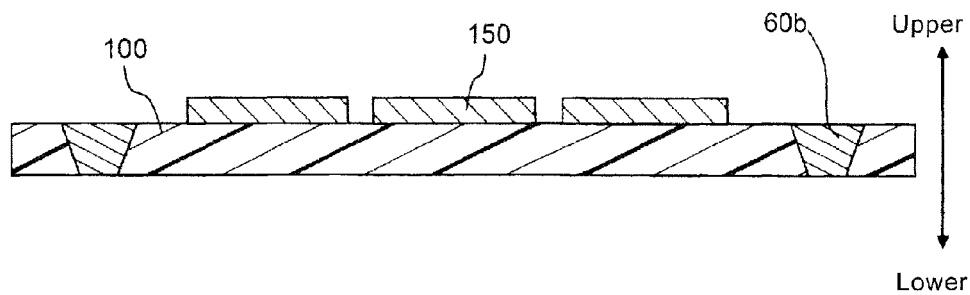
(b) 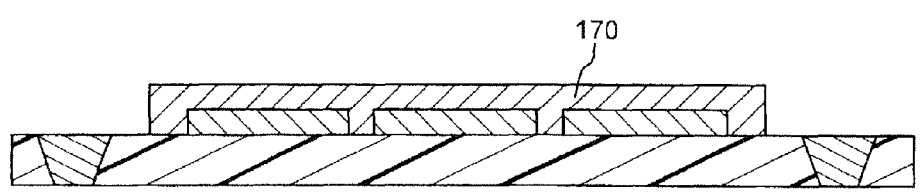
(c) 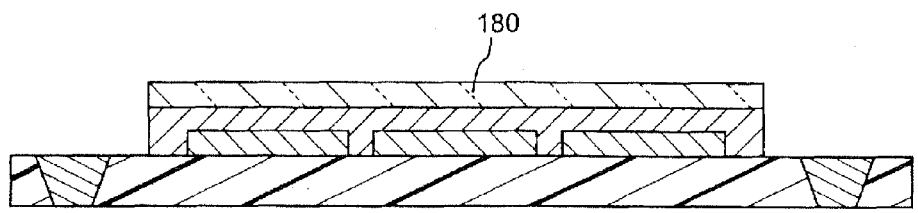
(d) 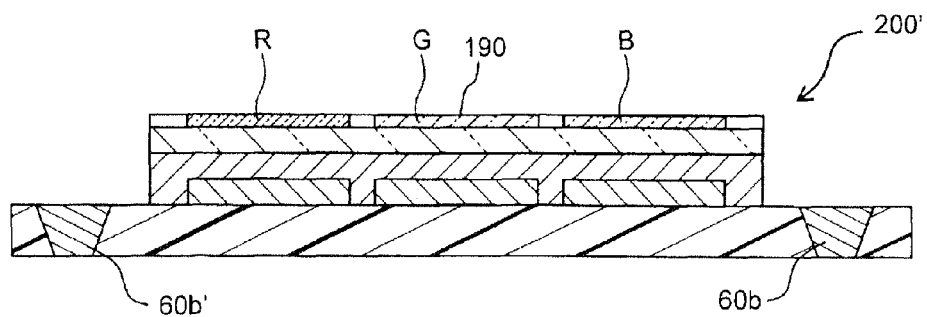

FLEXIBLE SEMICONDUCTOR DEVICE, METHOD FOR MANUFACTURING THE SAME, IMAGE DISPLAY DEVICE USING THE SAME AND METHOD FOR MANUFACTURING THE IMAGE DISPLAY DEVICE

TECHNICAL FIELD

The present invention relates to a flexible semiconductor device with its flexibility, and also a method for manufacturing the same. More particularly, the present invention relates to the flexible semiconductor device which can be used as a TFT, and also the method for manufacturing the same. Furthermore, the present invention relates to an image display device using such a flexible semiconductor device, and also a method for manufacturing the image display device.

BACKGROUND OF THE INVENTION

There is a growing need for a flat-panel display for use in a computer with a wide spreading use of information terminals. With further advancement of informatization, there are also increasing opportunities in which information, which has been conventionally provided by paper medium, is digitized. Particularly, the needs for an electronic paper or a digital paper have been recently increasing since they are thin and light weight mobile display media which can be easily held and carried (see Patent document 1, described below).

Generally, the display medium of a flat panel display device is formed by using an element such as a liquid crystal, an organic EL (organic electroluminescence) and an electrophoresis. In such display medium, a technology which uses an active drive element (TFT element) as an image drive element has become a mainstream to ensure a uniformity of the screen luminosity and a screen rewriting speed and so forth. For example, in the conventional display device for use in the computer, TFT elements are formed on a substrate wherein the liquid crystal element, the organic EL element or the like is sealed.

As a TFT element, semiconductors including a-Si (amorphous silicon) and p-Si (polysilicon) can be mainly used. These Si semiconductors as well as metal materials used for electrodes and wirings are subjected to a multilayering process wherein each of a source electrode, a drain electrode and a gate electrode is sequentially stacked on the substrate, which leads to an achievement of the production of the TFT element.

PATENT DOCUMENTS (PRIOR ART PATENT DOCUMENTS)

[Patent document 1] Japanese Unexamined Patent Publication (Kokai) No. 2007-67263

SUMMARY OF THE INVENTION

Problems to be Solved by the Invention

With the advance of the largeness of the display, it is required for the larger TFT substrate having a plurality of TFT elements mounted thereon to be larger. However, the larger substrate leads to an increase in wiring resistance, and thereby causing problems with a voltage drop. If the thicker wirings are used in order to avoid such problems, the film formation time on the TFT substrate is then increased because of the vacuum deposition process (which is usually performed for the formation of the general TFT substrate), and thereby impairing the productivity thereof, which will result in a significant increase in the production cost.

The inventors of the present application tried to dissolve such problems not by following up the conventional way, but by focusing on a new way. The present invention has been accomplished in view of the above matters, and thus a main object of the present invention is to provide a method for manufacturing a flexible semiconductor device which is excellent in productivity, and also to provide a flexible semiconductor device with a high performance by such method. Furthermore, another object of the present invention is to provide a method for manufacturing an image display device in which the above flexible semiconductor device is laminated, and also to provide a high-performance image display device by such method.

Means for Solving the Problem

In order to achieve the above-mentioned objects, the present invention provides a flexible semiconductor device comprising:
  a gate electrode;
  a gate insulating film disposed on the gate electrode;
  a semiconductor layer disposed on the gate insulating film, the semiconductor layer being opposed to the gate electrode;
  source and drain electrodes which are in contact with the semiconductor layer;
  a flexible film layer disposed such that the semiconductor layer and the source and drain electrodes are covered with the flexible film layer; and
  a first metal foil provided on the flexible film layer,
  wherein a wiring is made of a part of the first metal foil, and
  wherein the flexible film layer is provided with a plurality of vias extending in a thickness direction thereof, at least one of the vias being an alignment marker (i.e., positioning marker).

The term "flexible" of the "flexible semiconductor device" used in the present description substantially means that the semiconductor device has such flexibility characteristic that the device can be inflected. The "flexible semiconductor device" of the present invention may also be referred to as "flexible semiconductor element", in view of the structure thereof.

The term "plurality" of the phrase "a plurality of vias" used in the present description substantially means the number of the vias which can be generally provided in the conventional flexible semiconductor device (e.g., TFT element). The concrete number of the vias depends on an application of the flexible semiconductor device (e.g., TFT element). Take an image display device as an example, the number of the vias can be in the range of about 150000 to 70000000 in the light of the fact that the number of pixels of the general image display device is for example in the range of about 76800 (320×240) to about 35000000 (8192×4320), and that two vias are provided per pixel.

One of characterizing features of the flexible semiconductor device according to the present invention is that at least one of the vias is an alignment marker. The term "alignment" as used in the present invention means an alignment (i.e., positioning) regarding a relative positional relationship among various constituent elements of the flexible semiconductor device or a relative positional relationship among various elements associated with the flexible semiconductor device.

In one preferred embodiment, the flexible semiconductor device further comprises a second metal foil provided below the semiconductor layer and an insulating layer provided on the second metal foil, and thereby the gate electrode is made of a part of the second metal foil, and also the gate insulating film is made of a part of the insulating layer. Such flexible semiconductor device according to this embodiment can be described as follow, for example:

The flexible semiconductor device comprising:
  a second metal foil;
  an insulating layer provided on the second metal foil;
  a semiconductor layer provided on the insulating layer;
  source and drain electrodes provided on the insulating layer, the source and drain electrodes being in contact with the semiconductor layer;
  a flexible film layer disposed such that the semiconductor layer and the source and drain electrodes are covered with the flexible film layer; and
    a first metal foil provided on the flexible film layer,
    wherein a part of the first metal foil is a wiring, a part of the insulating layer is a gate insulating film and a part of the second foil metal foil is a gate electrode, and
    wherein the flexible film layer is provided with a plurality of vias extending in a thickness direction thereof, at least one of the vias being an alignment marker (i.e., positioning marker).

In one preferred embodiment, the alignment marker is provided as a unit of at least two of the vias. In other words, a group of at least two of the vias substantially serves as the alignment marker.

In another preferred embodiment, the at least one of the vias has a taper shape in a thickness direction thereof. This means that the via serving as the alignment marker has a taper shape along a thickness direction of the via.

In still another preferred embodiment, the at least one of the vias extends from one of the principal surfaces of the flexible film layer to the other of the principal surfaces thereof. Specifically, the via serving as the alignment marker extends one of the principal surfaces of the flexible film layer to the other of the principal surfaces thereof through the flexible film layer.

In still another preferred embodiment, the at least one of the vias is an electrically-conductive part which comprises a metal.

Such flexible semiconductor device with the via serving as the alignment marker contained therein can be described as follow, for example:

The flexible semiconductor device comprising:
  a gate electrode;
  a gate insulating film disposed on the gate electrode;
  a semiconductor layer disposed on the gate insulating film, the semiconductor layer being opposed to the gate electrode;
  source and drain electrodes which are in contact with the semiconductor layer;
  a flexible film layer disposed such that the semiconductor layer and the source and drain electrodes are covered with the flexible film layer; and
    a first metal foil provided on the flexible film layer,
    wherein a wiring is made of a part of the first metal foil, and
    wherein the flexible film layer is provided with a plurality of vias extending in a thickness direction thereof, and a partially removed portion of the first metal foil is provided at a position of at least one of the vias.

It is preferred even in this flexible semiconductor device that, when the second metal foil is used, the second metal foil is provided below the semiconductor layer and the insulating layer provided on the second metal foil, and thereby the gate electrode is made of a part of the second metal foil, and the gate insulating film is made of a part of the insulating layer.

Such flexible semiconductor device with the second metal foil provided therein comprises:
  a second metal foil;
  an insulating layer provided on the second metal foil;
  a semiconductor layer provided on the insulating layer;
  source and drain electrodes provided on the insulating layer, the source and drain electrodes being in contact with the semiconductor layer;
  a flexible film layer disposed such that the semiconductor layer and the source and drain electrodes are covered with the flexible film layer; and
    a first metal foil provided on the flexible film layer,
    wherein a part of the first metal foil is a wiring, a part of the insulating layer is a gate insulating film and a part of the second foil metal foil is a gate electrode, and
    wherein the flexible film layer is provided with a plurality of vias extending in a thickness direction thereof, and a partially removed portion of the first metal foil is provided at a position of at least one of the vias.

In the flexible substrate according to one embodiment of the present invention, the metal foil is provided as a form of metal layer in the device. In other words, the flexible semiconductor device according to this embodiment can be described as follows:

The flexible semiconductor device comprising:
  a gate electrode;
  a gate insulating film disposed on the gate electrode;
  a semiconductor layer disposed on the gate insulating film, the semiconductor layer being opposed to the gate electrode;
  source and drain electrodes which are in contact with the semiconductor layer;
  a flexible film layer disposed such that the semiconductor layer and the source and drain electrodes are covered with the flexible film layer; and
    a first metal layer provided on the flexible film layer,
    wherein a wiring is made of a part of the first metal layer, and
    wherein the flexible film layer is provided with a plurality of vias extending in a thickness direction thereof, and at least one of the vias being an alignment marker.

The flexible semiconductor device comprising:
  a gate electrode;
  a gate insulating film disposed on the gate electrode;
  a semiconductor layer disposed on the gate insulating film, the semiconductor layer being opposed to the gate electrode;
  source and drain electrodes which are in contact with the semiconductor layer;
  a flexible film layer disposed such that the semiconductor layer and the source and drain electrodes are covered with the flexible film layer; and
    a first metal layer provided on the flexible film layer,
    wherein a wiring is made of a part of the first metal layer, and
    wherein the flexible film layer is provided with a plurality of vias extending in a thickness direction thereof, and a partially removed portion of the first metal layer is provided at a position of at least one of the vias.

Moreover, it is also preferred that the second metal foil is provided as a form of metal layer in the device, a part of which is the gate electrode.

In another preferred embodiment (especially in the embodiment wherein the flexible semiconductor device is used for an image display device), a pixel electrode is provided on the flexible semiconductor device. It is preferred in this embodiment that the pixel electrode is made of a part of the metal foil or metal layer provided on the flexible film layer. This means that not only the wiring is made of the part of the first metal foil or layer, but also the pixel electrode is made of a part of the first metal foil or layer.

The present invention further provides a method for manufacturing the above flexible semiconductor device. The manufacturing method of the present invention comprises the steps of:

forming a gate electrode;

forming a gate insulating film so that the gate insulating film contacts with the gate electrode;

forming a semiconductor layer on the gate insulating film such that the semiconductor layer is opposed to the gate electrode;

forming source and drain electrodes so that the source and drain electrodes contact with the semiconductor layer;

forming a flexible film layer so that the flexible film layer covers the semiconductor layer and the source and drain electrodes;

forming vias in the flexible film layer;

forming a first metal layer by disposing a metal foil onto the flexible film layer, and thereby a semiconductor device precursor is provided; and subjecting the first metal layer to a processing treatment to form a wiring (i.e., wiring layer) from a part of the first metal layer, wherein, in the step of the processing treatment of the first metal layer, the wiring is formed in a predetermined position by using at least one of the vias as an alignment marker (i.e., positioning marker).

One of the characterizing features of the manufacturing method according to the present invention is that at least one of the vias of the semiconductor device precursor is used as an alignment marker, and thereby the alignment of the processing treatment of the metal layer is performed. Accordingly, the processing treatment of the metal layer disposed on the flexible film layer can be suitably performed with no misalignment at a desired position, and thus the wiring and the pixel electrode can be accurately formed at their predetermined positions. Specifically, when some functional layer is laminated onto the semiconductor device, each of the wiring and the pixel electrode can be suitably formed at such a predetermined position that is suitable for the laminationo of the functional layer.

The phrase "the wiring is formed in a predetermined position" as used in the present invention means that the wiring is formed in a desired position as originally intended. More specifically, such phrase means that, when some functional layer is laminated onto the semiconductor device, the wiring is suitably formed at such a predetermined position that is suitable for the functional layer to be laminated. As an example of "the wiring is formed in a predetermined position", the wiring serving as a power supply line for delivering electricity to a transistor of each pixel is suitably formed at a corresponding pixel region of the transistor with no overlapping with respect to the adjacent pixel regions.

Preferably, the manufacturing method of the present invention further comprises the step of providing another metal foil used for the formation of the gate electrode to form a second metal layer, and then forming an insulating layer serving as the gate insulating layer on one of principal surfaces of the second metal layer. In this case, the second metal layer is subjected to a processing treatment to form the gate electrode from a part of the second metal layer, whereas the first metal layer is subjected to the processing treatment to form the wiring from the part of the first metal layer.

In one preferred embodiment, the forming step of the wiring from the part of the first metal layer comprises sub-steps of:

forming a photo-resist film on the first metal layer;

subjecting the photo-resist film to a light-exposure treatment and a developing treatment, and thereby removing at least part of the photo-resist film; and subjecting the first metal layer to an etching treatment via the photo-resist film at least part of which has been removed, and thereby forming the wiring from the first metal layer. In the step of the light-exposure treatment of the photo-resist film in this embodiment, a predetermined position of the photo-resist film is exposed to the light by using the at least one of the vias of the semiconductor device precursor as the alignment marker. According to this embodiment, a direct exposure of the photo-resist film can be suitably performed so that the wiring is formed in a desired position, which will lead to an accurate formation of the wiring in the predetermined position. In other words, when some functional layer is laminated onto the semiconductor device, the wiring (and additionally pixel electrode) is accurately formed at such a predetermined position that is suitable for the lamination of the functional layer. Therefore, the phrase "predetermined position of the photo-resist film is exposed to the light" means that a desired local region of the photo-resist film is exposed to the light as originally intended. More specifically, such phrase means that the local region of the photo-resist film is exposed to the light such that the wiring is suitably formed at such a predetermined position that is suitable for the lamination of the functional layer.

In one preferred embodiment, the forming step of the gate electrode from the part of the second metal layer comprises sub-steps of:

forming a photo-resist film on the other of the principal surfaces of the second metal layer;

subjecting the photo-resist film to a light-exposure treatment and a developing treatment, and thereby removing at least part of the photo-resist film; and subjecting the second metal layer to an etching treatment via the photo-resist film at least part of which has been removed, and thereby forming the gate electrode from the second metal layer, wherein the etching treatment of the first metal layer and the etching treatment of the second metal layer are performed in the same etching process. In this embodiment, a direct exposure of the photo-resist film can be suitably performed so that the gate electrode is formed in a desired position, which leads to an accurate formation of the gate electrode in the predetermined position. In other words, the gate electrode can be accurately formed in the predetermined position with respect to the channel portion of the TFT structure in the flexible semiconductor device by the alignment performed upon the direct light-exposure of the photo-resist film. Similarly, the phrase "predetermined position of the photo-resist film is exposed to the light" means that a desired local region of the photo-resist film is exposed to the light as originally intended. More specifically, such phrase means that the local region of the photo-resist film is exposed to the light such that the gate electrode is formed in such a suitable position that the manufactured flexible semiconductor device can function as a TFT. For example, the local region of the photo-resist film is exposed to the light such that the gate electrode is formed in such a suitable position that the formed gate electrode and the channel are positioned in an overlapping relation with each other with no misalignment.

As for the manufacturing method of the flexible semiconductor device according to the present invention, it is possible in the step of subjecting the photo-resist film to the light-exposure treatment and the developing treatment, and thereby removing at least part of the photo-resist film that a photomask is disposed on the photo-resist film, and thereafter the photo-resist film with the photomask disposed thereon is subjected to the light-exposure and developing treatments to remove at least part of the photo-resist film. In this case, it is preferred that, instead of using the alignment marker upon subjecting the photo-resist film to the light-exposure treatment, an alignment of the photomask is performed upon the disposing thereof by using the at least one of the vias of the semiconductor device precursor as the alignment marker. In so doing, the light-exposure and developing treatments of the photo-resist film through the photomask can be suitably performed in the predetermined portion of the photo-resist film with no misalignment, which leads to an accurate formations of the wiring, the pixel electrode and the gate electrode in their predetermined positions. As for the formation of the wiring, the wiring can be accurately formed at such a predetermined position that is suitable for the lamination of the functional layer.

Upon the processing treatment of the metal foil, the light-exposure treatment of the photo-resist film or the disposing of the photomask, a X-ray transmission image obtained by irradiating the semiconductor device precursor with a X-ray may be used wherein a via-corresponding point in the X-ray transmission image may be used as a positioning reference. In particular, it is preferred that at least two of the vias are used as a unit which constitutes the alignment marker, and thus the via-corresponding points in the X-ray transmission image, which correspond to the vias of the unit, are preferably used as the positioning reference.

The present invention further provides an image display device using the above flexible semiconductor device. The image display device comprises:

the flexible semiconductor device; and an image display unit composed of a plurality of pixels, the unit being provided over the flexible semiconductor device, wherein at least one of the vias provided in the flexible semiconductor device is an alignment marker (i.e., positioning marker).

One of the characterizing features of the image display device according to the present invention is that at least one of the vias provided in the flexible semiconductor device is an alignment marker.

In one preferred embodiment, the image display unit comprises:

a pixel electrode provided on the flexible semiconductor device;

a light emitting layer provided over the pixel electrode; and a transparent electrode layer provided on the light emitting layer. In this embodiment, the light emitting layer is provided at a region partitioned by a pixel regulating part. Namely, the image display unit can comprise:

the flexible semiconductor device; and the pixel electrode provided on the flexible semiconductor device;

a plurality of the light emitting layers provided at the regions partitioned by the pixel regulating part, the light emitting layers being provided over the pixel electrode;

the transparent electrode layer provided on the plurality of the light emitting layers, wherein at least one of the vias provided in the flexible semiconductor device is the alignment marker. The image display unit may comprise a color filter provided on the transparent electrode layer. Namely, the image display unit can comprise:

the flexible semiconductor device; and the pixel electrode provided on the flexible semiconductor device;

the light emitting layer provided over the pixel electrode;

the transparent electrode layer provided on the light emitting layer; and the color filter provided on the transparent electrode layer, wherein at least one of the vias provided in the flexible semiconductor device is the alignment marker.

Furthermore, the present invention provide a method for manufacturing the above image display unit. Such manufacturing method comprises the steps of:

(I) providing the flexible semiconductor device equipped with a pixel electrode; and (II) forming an image display unit composed of a plurality of pixels over the flexible semiconductor device, wherein, in the step (II), an alignment of the image display unit is performed upon the formation thereof by using at least one of the vias of the flexible semiconductor device as an alignment marker (i.e., positioning marker).

One of the characterizing features of the manufacturing method of the image display device according to the present invention is that the alignment of the image display unit is suitably performed upon the formation thereof by using at least one of the vias of the flexible semiconductor device as the alignment marker. For example in a case where a plurality of pixel regulating parts are formed, and then the pixels are formed on regions of the pixel electrode in the step (II), the regions being partitioned by the pixel regulating parts, an alignment of the pixel regulating parts may be formed upon the formation thereof by using at least one of the vias of the flexible semiconductor device as the alignment marker. In so doing, an alignment of the photomask for forming the pixel regulating parts can be suitably performed, and thereby the light emitting layer can be formed with no misalignment. In other words, the light emitting layer can be accurately formed in the predetermined position with respect to the pixel (i.e., circuit with TFT contained therein). Alternatively, in a case where the light emitting layer is formed over the pixel electrode such that the light emitting layer covers the pixel electrode, and then a color filter is formed on the light emitting layer in the step (II), an alignment of the color filter may be performed upon the formation thereof by using at least one of the vias of the flexible semiconductor device as the alignment marker.

Effect of the Invention

In accordance with the present invention, a suitable alignment regarding a relative positional relationship among various constituent elements of the flexible semiconductor device or a relative positional relationship among various constituent elements of the image display device using the flexible semiconductor device can be achieved. For example, the present invention makes it possible to accurately form the wiring and the pixel electrode in the predetermined position of the flexible semiconductor device. Therefore, when the flexible semiconductor device is used for the image display device, the accurate alignment of the pixel electrode and the wiring with respect to the pixel can be performed. In a case where the gate electrode is formed from a part of the metal layer, the gate electrode can be accurately located in the predetermined position with respect to the channel of the TFT structure of the flexible semiconductor device. Moreover, the pixel regulating parts and light emitting layer can also be accurately located in the predetermined position of the image display device, which can effectively prevent a cumulative risk of the misalignment regarding the constituent elements of the image display device.

The alignment marker can be easily formed upon the formation of the required elements (e.g., contact via) of the flexible semiconductor device. Further, the improved alignment attributed to the alignment marker can improve a production yield of the flexible semiconductor or image display devices. This means that the present invention can provide a high productivity of the manufacturing method. Further, the flexible semiconductor device or the image display device according to the present invention can have a high performance since the alignment marker enables the various constituent elements to be accurately positioned with no misalignment.

Furthermore, the wiring of the flexible semiconductor device according to the present is formed by the use of the metal layer (e.g., metal foil), and thus the larger thickness of the wiring can be achieved as appropriate. The larger thickness of the wiring leads to an achievement of a reduced electric resistance. Accordingly, there is realized a larger device with a reduced influence of the voltage drop. The larger thickness of the wiring also makes it possible to realize a large display with a high-speed performance due to a reduced RC delay.

BRIEF DESCRIPTION OF THE DRAWINGS

FIG. 5 is a cross sectional view schematically illustrating a relative positional relationship between the gate electrode and the channel.

FIGS. 7(a) to 7(d) are cross sectional views schematically illustrating the steps in a manufacturing process of a flexible semiconductor device according to an embodiment of the present invention.

FIGS. 8(a) to 8(c) are cross sectional views schematically illustrating the steps in a manufacturing process of a flexible semiconductor device according to an embodiment of the present invention.

FIG. 10 is a view schematically illustrating an embodiment wherein a direct exposure is performed.

FIGS. 11(a) to 11(c) are cross sectional views schematically illustrating the steps in a manufacturing process of a flexible semiconductor device according to an embodiment wherein a gate electrode is formed by the use of the metal foil.

FIGS. 12(a) and 12(b) are cross sectional views schematically illustrating the steps in a manufacturing process of a flexible semiconductor device according to an embodiment wherein a gate electrode is formed by the use of the metal foil.

FIGS. 13(a) and 13(b) are cross sectional views schematically illustrating an embodiment wherein an alignment of photomask is performed by using X-ray transmission image of an alignment marker.

FIGS. 14(a) to 14(c) are schematic illustrations for showing dispositions of alignment markers.

FIG. 15 is a schematic illustration for showing alignment markers provided as a unit.

FIGS. 16(a) to 16(c) are views schematically illustrating an embodiment wherein an alignment of photomask is performed by making use of visible light.

FIG. 18 is a plan view illustrating an exampled embodiment wherein the drive circuit of FIG. 17 is constructed by a flexible semiconductor device.

FIGS. 22(a) to 22(d) are cross sectional views schematically illustrating the steps in a manufacturing process of an image display device equipped with a color filter.

EXPLANATION OF REFERENCE NUMERALS

Figure 1:
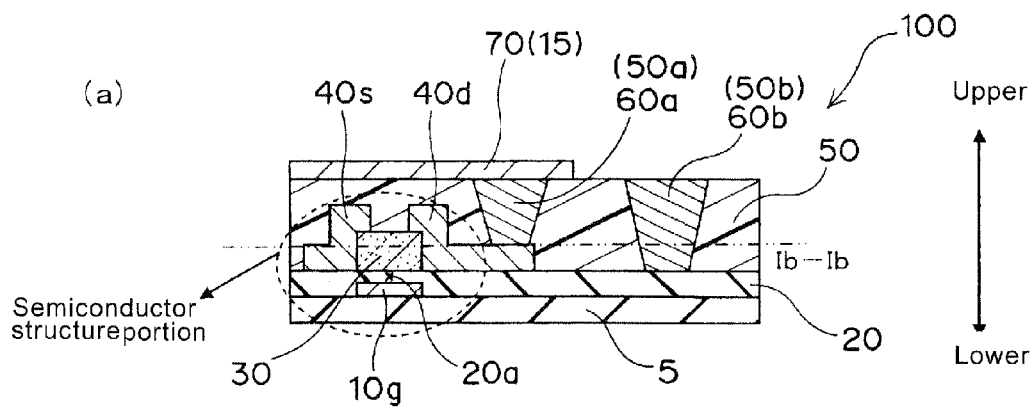
FIG. 1(a) is a cross sectional view schematically illustrating a flexible semiconductor device according to an embodiment of the present invention.
FIG. 1(b) is a plan view illustrating the flexible semiconductor device taken along a line Ib-Ib of FIG. 1(a).

5: Supporting substrate
10g: Gate electrode
12: Photomask
15: Metal layer or metal foil
20: Insulating layer (Insulating film)
20a: Gate insulating film (Gate insulating layer)
30: Semiconductor layer
40s, 40d: Source electrode, Drain electrode
50: Flexible film layer 50a, 50b: Openings provided in flexible film layer
60: Via
60a: Contact via (Via)
60b: Alignment marker (Via)
70: Wiring layer
80: Display portion
82: Wiring
85: Capacitor
90: Driving circuit
92: Data line
93: Power-supply line
94: Selection line
100, 100a, 100b: Flexible semiconductor device
100': Semiconductor device precursor
110: X-ray transmission image
120: Via-corresponding point
150: Pixel electrode
160: Pixel regulating part
160': Pixel regulating part precursor
165: Photomask used for formation of pixel regulating part
170: Light emitting layer
180: Transparent electrode layer
190: Color filter
200: Image display device
200': Image display device

DETAILED DESCRIPTION OF THE INVENTION

Hereinafter, some embodiments of the present invention will be described with reference to Figures. For simplified explanation, the same reference numeral of the following Figures indicates the element which has substantially the same function. The dimensional relationship (length, width, thickness and so forth) in each Figure does not reflect a practical relationship thereof.

Each "direction" referred to in the present description means the direction based on the spatial relationship between the gate electrode 10g and the semiconductor layer 30, in which each of upward direction and downward direction is mentioned relating to the direction in the drawings for convenience. Specifically, the upward direction and the downward direction respectively correspond to the upward direction and the downward direction in each drawing. The side on which the semiconductor layer 30 is formed based on the gate electrode 10g is referred to as "upward direction" and the side on which the semiconductor layer 30 is not formed based on the gate electrode 10g is referred to as "downward direction".

《Flexible Semiconductor Device》

With reference to FIGS. 1(a) and (b), the flexible semiconductor device 100 according to one embodiment of the present invention will be explained. FIG. 1(a) is a schematic sectional structure of the flexible semiconductor device 100 whereas FIG. 1(b) is a plan view of the device taken along a line Ib-Ib of FIG. 1(a).

The device of the present invention is a flexible semiconductor device equipped with a flexible film. As illustrated in FIGS. 1(a) and 1(a), the flexible semiconductor device 100 comprises a semiconductor structure portion and a film layer 50 formed so as to cover the semiconductor structure portion. More specifically, the flexible semiconductor device 100 of the present invention comprises a gate electrode 10g, a gate insulating film 20a formed on the gate electrode 10g, a semiconductor layer 30 formed on the gate insulating film 20a, source and drain electrodes 40s, 40d formed in contact with the semiconductor layer 30, a flexible film layer 50 formed such that the semiconductor layer 30 and the source and drain electrodes 40s, 40d are covered with the flexible film layer, and a metal layer 15 formed on the flexible film layer 50. A part of the metal layer 15 is wiring 70 in the flexible semiconductor device 100 according to the present invention.

Figure 2:
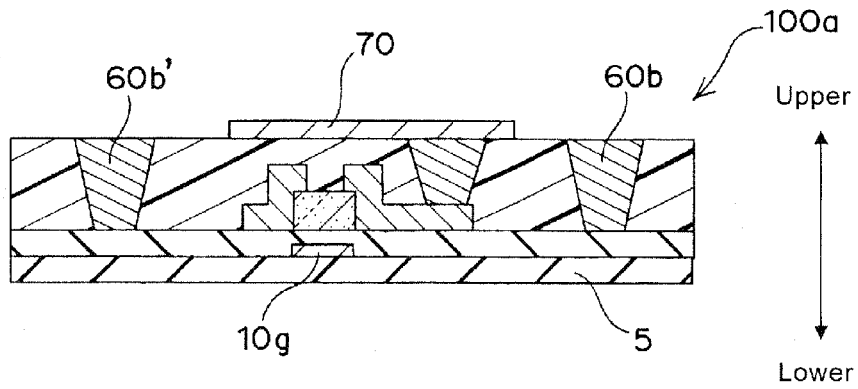
FIG. 2 is a cross sectional view schematically illustrating a flexible semiconductor device according to an embodiment of the present invention.

As seen from a sectional view of the device, the film layer 50 of the flexible semiconductor device 100 according to the present invention has an opening 50a and an opening 50b formed therein. The opening 50a extends between the upper surface of the semiconductor structure portion and the upper surface of the semiconductor device 100. The opening 50b extends between the upper surface of the insulating layer 20 and the upper surface of the semiconductor device 100. The openings 50a, 50b are respectively provided with electrically-conductive parts formed therein. The electrically-conductive part in the opening 50a serves as a contact via 60a connecting between a circuit provided in a layer of the semiconductor structure portion and a circuit provided on the resin film. While on the other hand, the electrically-conductive part in the opening 50b serves not as the contact via but as an alignment marker 60b (which will be described later) although it is similar to that of the opening 50a in terms of an electrically-conductive material. Thus, the flexible film layer 50 of the present invention 100 is provided with a plurality of vias extending in a thickness direction of the film layer, wherein at least one of the vias is the alignment marker (i.e., "positioning marker"). FIG. 1 illustrates an embodiment wherein only the via 60b is the alignment marker, whereas FIG. 2 illustrate two vias (60b, 60b') are provided as the alignment markers.

The film layer 50 is preferably made of a resin material which has flexibility. It is thus preferred that the flexible film layer 50 is a resin film. This resin film can serve as a supporting substrate for supporting the semiconductor structure portion (or TFT structure therewith) and is preferably made of a thermoplastic resin material or a thermosetting resin material having flexibility characteristic after being cured. Moreover, it is particularly preferred in the present invention that the resin film is adapted for the formation of the opening. Examples of the resin film preferably include at least one resin selected from the group consisting of an epoxy resin, a polyimide resin, an acrylic resin, a polyethylene terephthalate resin, a polyethylenenaphthalate resin, a polyphenylene sulfide resin, a polyphenylene ether resin, a liquid crystal polymer and a polytetrafluoroethylene. Just as an example, the resin film may be a polyimide film. These resin materials are excellent in the dimensional stability and thus is preferably used as a flexible material of the flexible semiconductor device. For forming the opening in the resin film, a laser processing may be adopted by using a carbon dioxide laser, YAG laser or the like. A photolithography may also be adopted so as to form the opening in the resin film. In this case, a resin material suitable for the photolithography (e.g., resin film made of photosensitive resin) is preferably used. Furthermore, an inorganic polymer material film, e.g., a siloxane polymer film can be suitably used as the flexible film layer 50 since it has a flexibility and is appropriate for the formation of the opening.

Just as an example, in a case where an adhesive material is provided on a bonded surface of the flexible film layer, the flexible film layer may have a thickness of about 2 μm to about 100 μm and the adhesive material layer may have a thickness of about 3 μm to about 20 μm.

The electrically-conductive part of the flexible semiconductor device 100 has an identification capability serving as the alignment marker as well as an electrically-conductive capability serving as a contact via. For example, in a case where X-ray is used for the alignment marker (which will be described later), it is preferred that the electrically-conductive part comprises a metal component.

As for the electrically-conductive parts (i.e., vias 60a,60b) provided within the openings 50a,50b of the flexible film layer 50, those made from an electroconductive paste material are preferable in terms of cost and productivity. As the electroconductive paste material, the paste material obtained by dispersing a single metal such as Au, Ag, Cu, Pt, Pd, Al and/or Pb, the mixture or alloy thereof, an electroconductive filler such as a carbon filler, a carbon nanotubes and the like into a binder which contains an organic resin (e.g., an epoxy resin) and/or a solvent (e.g., butylcarbitol acetate (BCA)). The electroconductive parts (vias 60a,60b) can be provided through filling the openings 50a,50b with such electroconductive paste material.

It is also possible to fill a metal (e.g., Au, Ag, Cu, Ni, Co, Cr, Mn, Fe, Ru, Rh, Pd, Ag, Os, Ir and/or Pt) in the openings 50a,50b by performing a plating process for the purpose of forming the electrically-conductive parts (i.e., vias 60a,60b). In particular, a Cu plating process is preferred since it is comparatively inexpensive and the metal Cu in itself has a high electroconductivity. In this regard, the metal Cu is preferred in terms of the identification capability upon the X-ray irradiation since it is a high-atomic-number-element.

As a semiconductor material which constitutes the semiconductor layer 30 of the flexible semiconductor device 100, any suitable materials may be used. For example, the semiconductor layer may be made of silicon (e.g., Si), germanium (Ge) and the like. The semiconductor layer may also be made of an oxide. The oxide of the oxide semiconductor may be an oxide of an elementary substance such as $ZnO$, $SnO_2$, $In_2O_3$ and/or $TiO_2$, or a composite oxide such as InGaZnO, InSnO, InZnO and/or ZnMgO. As needed, a compound semiconductor may also be used, in which case a compound thereof is for example GaN, SiC, ZnSe, CdS and/or GaAs and so forth. Furthermore, an organic semiconductor may also be used, in which case an organic thereof is for example pentacene, poly-3-hexyl-thiophene, porphyrin derivatives, copper phthalocyanine and/or C60 and so forth.

It is preferred that the flexible semiconductor device 100 of the present invention comprises the semiconductor structure portion which has been subjected to an annealing treatment. Specifically, it is preferred that, as a result of the heat treatment of the semiconductor layer 30 induced by the laser irradiation, a film quality of the semiconductor structure portion has been modified as compared with that before the laser irradiation. As an example, a component of the semiconductor layer may be modified from an amorphous silicon (before the irradiation) to a polycrystalline silicon (after the irradiation). Such polycrystalline silicon has its average particle diameter of a few hundred nm to about 2 micrometers, for example. In a case where the semiconductor layer 30 consists of polycrystalline silicon at the point in time before the laser irradiation, the degree of the crystallization thereof can be improved by the irradiation. Moreover, the modification of the film quality of the semiconductor structure portion can improve a mobility of the semiconductor layer 30. This means that there may be a significant difference in the mobility of the semiconductor layer 30 between the before-irradiation and the after-irradiation.

As will be appreciated from the foregoing, the term "film quality" used in the present description substantially means the properties such as "crystalline condition", "degree of crystallization" and/or "mobility" of the semiconductor layer. In other words, the modification of the film quality substantially means that "crystalline condition", "degree of crystallization" and/or "mobility" change(s) or improve(s) as far as the semiconductor layer is concerned.

Even in a case where the oxide semiconductor is used instead of the silicon semiconductor, the semiconductor properties can also be improved. For example in a case of the crystalline oxide semiconductor such as ZnO, there are relatively large amount of amorphous state in the crystalline layer immediately after being formed as a film by a sputtering and the like, and thereby frequently failing to show the properties of the semiconductor (i.e., performance of the semiconductor device). However, the performing of the annealing treatment makes it possible to improve the crystallinity of the oxide semiconductors (e.g., ZnO), which leads to an improved performance of the semiconductor.

As an example regarding the above, when ZnO is formed by a RF magnetron sputtering process in the order of the formations of ZnO film (50 nm) and $SiO_2$ film (50 nm), the formed layer only shows as low mobility as 1 $cm^2/Vs$ or lower at the point in time before the excimer laser irradiation. While on the other hand, after the excimer laser irradiation, the layer becomes capable of functioning as the semiconductor and thus it can have a mobility of about 20 $cm^2/Vs$.

Also as for the amorphous oxide semiconductor such as InGaZnO, the effects of improving the semiconductor properties can be provided. In the case of the amorphous oxide semiconductor, an oxygen deficiency can be restored and thus the mobility can be improved due to the laser irradiation under the oxygen atmosphere (for example, air atmosphere). In a case where an oxide film (e.g., $SiO_2$ or $Al_2O_3$ film) is provided as the gate insulating layer 20, the oxygen deficiency of the amorphous oxide semiconductor can be restored due to an oxygen supplied thereto through the insulating layer 20 from the openings 50a,50b. When the TFT is produced using InGaZnO as the semiconductor material, the very low mobility (i.e., about 1 $cm^2/Vs$ or lower) before the laser irradiation can be increased to the degree of about 10 $cm^2/Vs$ after the laser irradiation.

In the flexible semiconductor device 100 of the present invention, the semiconductor structure portion may be supported substantially by a supporting substrate 5. There is no limitation to the kind of the supporting substrate 5 as long as it can support the constituent elements (e.g., semiconductor structure portion) of the TFT. For example, a glass substrate or a resin substrate (e.g., a substrate made of PET, PI or the like) may be used as the supporting substrate 5.

On the supporting substrate 5, there is provided the gate electrode 10g. Examples of the material of the gate electrode 10g include a metallic material such as gold (Au), silver (Ag), copper (Cu), nickel (Ni), chromium (Cr), cobalt (Co), magnesium (Mg), calcium (Ca), platinum (Pt), molybdenum (Mo), iron (Fe), zinc (Zn), titanium (Ti) and/or tungsten (W) and the like; an electrically-conductive oxide such as tin oxide ($SnO_2$), indium tin oxide (ITO), fluorine-containing tin oxide (FTO), ruthenium oxide ($RuO_2$), iridium oxide ($IrO_2$) and/or platinum oxide ($PtO_2$) and the like. Just as an example, the gate electrode 10g may be formed by the use of Ag paste. In this case, a printing process (e.g., ink-jet printing process) can be employed.

On the gate electrode 10g, there is provided the gate insulating film 20a. More specifically, the insulating layer 20 which constitutes the gate insulating film 20a is provided on the supporting substrate 5 such that the gate electrode 10g is covered with the insulating layer 20. The material of the insulating layer 20 may be inorganic insulating material such as silicon oxide and silicon nitride. However, the material of the insulating layer 20 is not limited to the above, but any suitable materials may be used depending on the property required for the gate insulating film. For example, an organic insulating material (e.g., polyimide) may also be used as the material of the insulating layer 20.

In the flexible semiconductor device 100 of the present invention, the source and drain electrodes 40s,40d are in contact with the semiconductor layer 30. In the semiconductor layer 30, a region located between the source electrode 40s and the drain electrode 40d functions as a channel region. Examples of the material to be used as the source and drain electrodes 40s,40d include a metallic material such as gold (Au), silver (Ag), copper (Cu), nickel (Ni), chromium (Cr), cobalt (Co), magnesium (Mg), calcium (Ca), platinum (Pt), molybdenum (Mo), iron (Fe), zinc (Zn), titanium (Ti) and/or tungsten (W) and the like; an electrically-conductive oxide such as tin oxide ($SnO_2$), indium tin oxide (ITO), fluorine-containing tin oxide (FTO), ruthenium oxide ($RuO_2$), iridium oxide ($IrO_2$) and/or platinum oxide ($PtO_2$) and the like. For example, Ag paste may be used to form the source and drain electrodes 40s,40d. The source and drain electrodes 40s,40d using such paste material may be formed by the printing technique (e.g., ink jet printing process).

The flexible semiconductor device 100 of the present invention comprises the metal layer 15 on the flexible film layer 50, and a part of the metal layer 15 is the wiring 70. The metal layer 15 is preferably in a form of a metal foil. It is preferred that the metal which constitutes the metal foil is a metal with an electric conductivity and a relatively high melting point. For example, copper (Cu, melting point: 1083° C.), nickel (Ni, melting point: 1453° C.), aluminum (Al, melting point: 660° C.) and/or stainless steel (SUS) may be used.

Figure 3:
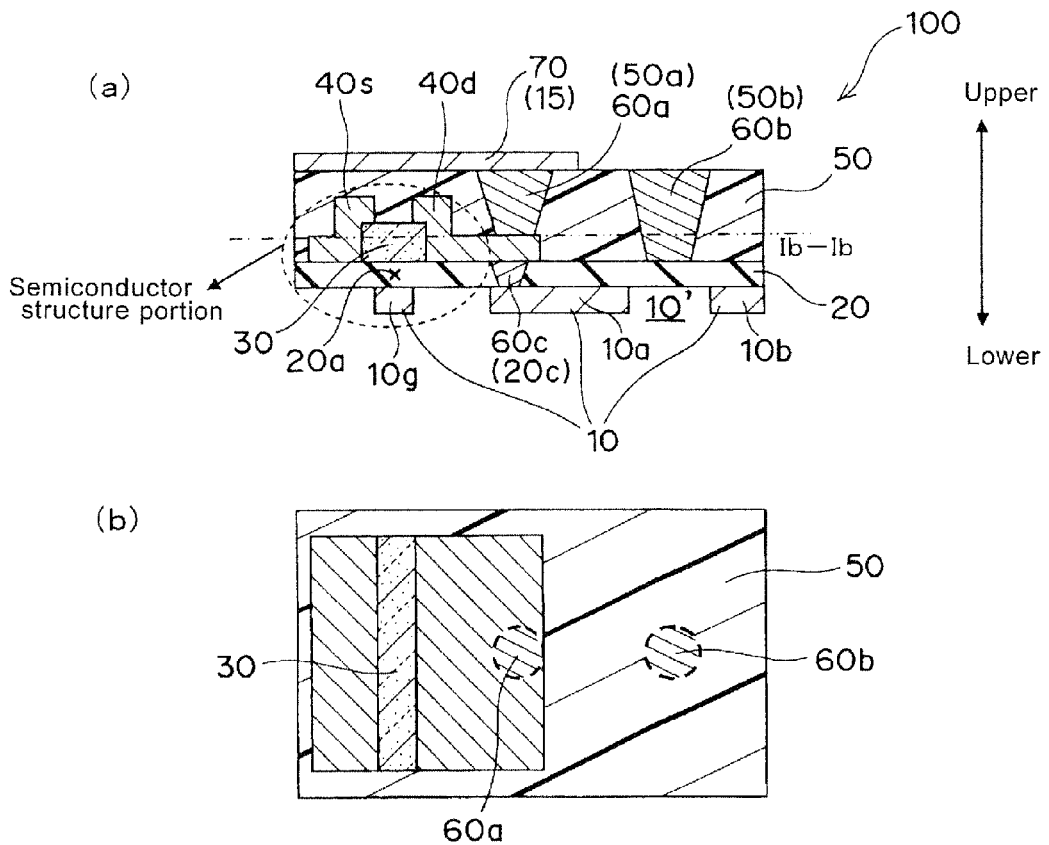
FIG. 3(a) is a cross sectional view schematically illustrating a flexible semiconductor device according to an embodiment of the present invention.
FIG. 3(b) is a plan view illustrating the flexible semiconductor device taken along a line Ib-Ib of FIG. 3(a).
Figure 4:
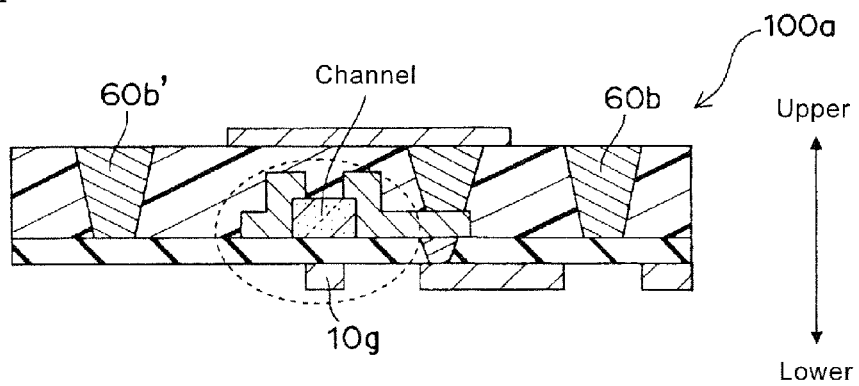
FIG. 4 is a cross sectional view schematically illustrating a flexible semiconductor device according to an embodiment of the present invention.
Figure 6:
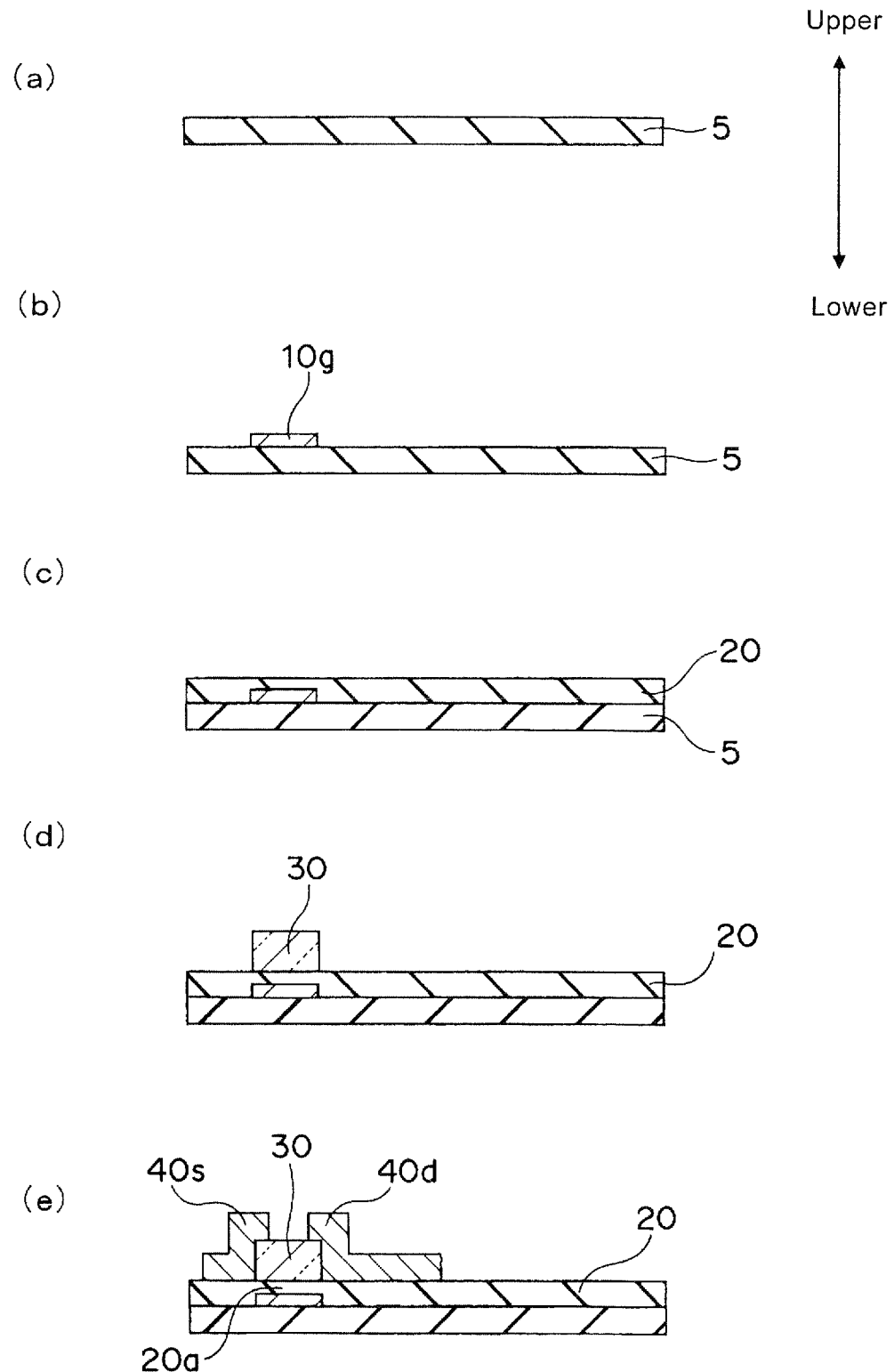
FIGS. 6(a) to 6(e) are cross sectional views schematically illustrating the steps in a manufacturing process of a flexible semiconductor device according to an embodiment of the present invention.

In the flexible semiconductor device 100, it is possible that, as shown in FIGS. 3 and 4, the gate electrode 10g is comprised of a part of the metal layer 10. It is particularly preferred in this case that not only the gate electrode 10g is comprised of a part of the metal layer 10, but also the gate insulating film 20a is comprised of a part of the insulating layer 20 when the metal layer 10 is provided below the semiconductor layer 30 and the insulating layer 20 is provided on the metal layer 10. Similarly to that of the metal layer 15, the metal layer 10 is also preferably in a form of a metal foil. It is also preferred that the metal layer 10 is comprised of a metal foil with an electric conductivity and a relatively high melting point, in which case such metal foil may be any suitable one made of copper, nickel, aluminum and/or a stainless steel, for example.

It is desired that the gate electrode 10g and the channel region have the same size as each other, and they are positioned in an overlapping relation with each other with no misalignment. The reason for this will be described with reference to FIG. 5. Supposing a case where the gate electrode 10g and the channel 30a are in misalignment with each other and another case where the gate electrode 10g is smaller than the channel 30a (see FIG. 5(a)), there is no portion of the gate electrode 10g below the channel region 30a in any of these cases. In these cases, even when the voltage is applied to the gate electrode 10g, an electrical charge is not induced at the no portion of the gate electrode. The channel portion 30a with no induced charge can only exhibit a low conductivity, and thereby the channel cannot fully function, which leads to a low electrical current extracted from the drain electrode. Thus, it is preferred that the whole of the channel region is covered with the gate electrode.

While on the other hand, in a case where the gate electrode 10g and the channel 30a are in misalignment with each other and another case where the gate electrode 10g is larger than the channel 30a (see FIG. 5(b)), there is an overlapping portion of the gate electrode 10g with respect to the source electrode 40s and/or the drain electrode 40d. In these cases, the parasitic capacitance of the transistor can be generated at the overlapping portion between the gate electrode 10g and the source electrode 40s, which can impair the transistor performance. Namely, the parasitic capacitance can lead to such undesired problems that a waveform of the output signal can become not sharp, or the amount of the required current can be increased and thereby causing the power consumption to be increased. The same is true on the relationship between the gate electrode 10g and drain electrode 40d. Accordingly, it is desired that there is smaller overlapping between the gate electrode 40g and the source electrode 40s.

It is therefore concluded that the gate electrode 10g and the channel region 30a have the same size as each other and they are positioned in an overlapping relation with each other with no misalignment (see FIG. 5(c)).

《Manufacturing Method of Flexible Semiconductor Device》

Next, with reference to FIGS. 6 to 12, the manufacturing method of the flexible semiconductor device 100 according to the present invention will be explained. FIGS. 6(a) to 6(e), FIGS. 7(a) to 7(d), FIGS. 8(a) to 8(c), FIG. 9, FIG. 10, FIGS. 11(a) to 11(c) and FIGS. 12(a) and 12(b) respectively show cross-sectional views illustrating the steps in a manufacturing process of the flexible semiconductor device 100.

Upon carrying out the manufacturing method of the present invention, a gate electrode is firstly formed. For example, the gate electrode may be formed on a supporting substrate. Subsequent to the formation of the gate electrode, a gate insulating film is formed on the gate electrode, and thereafter a semiconductor layer is formed on the gate insulating layer, followed by the formation of source and drain electrodes such that the source and drain electrodes contact with the semiconductor layer.

Specifically, as shown in FIG. 6(a), an insulating substrate is prepared as the supporting substrate 5. For example, a glass substrate is prepared. Such supporting substrate may have a thickness in the range of about 30 μm to about 5 mm, for example.

Subsequent to the preparation of the supporting substrate, a gate electrode 10g is formed on the supporting substrate 5, as shown in FIG. 6(b). The formation of the gate electrode 10g can be performed through an application of Ag paste by using of a printing process (e.g., a screen printing process, a gravure printing process, or an ink jet printing process). The thickness of the formed gate electrode 10g may be in the range of about 50 nm to about 5 μm, for example. The gate electrode 10g may be formed by subjecting a solid layer (e.g., solid Cu layer) obtained by a vacuum deposition process (e.g., sputtering process) to a photolithography etching process.

Subsequent to the formation of the gate electrode 10g, an insulating layer 20 is formed on the supporting 5 such that the gate electrode 10g is covered with the insulating layer 20. The insulating layer 20 can be formed by a sol gel process, for example. With respect to the sol gel process, the insulating layer 20 can be formed by applying (for example, spin-coating) an organic-inorganic hybrid material wherein organic molecules are bonded to the siloxane backbone, followed by calcinating it at about 300° C. to about 600° C. The thickness of the insulating layer 20 is approximately in the range of 0.1 μm to about 1 μm, for example.

Subsequent to the formation of the insulating layer 20, a semiconductor layer 30 is formed on the insulating layer 20. The formation of the semiconductor layer 30 can be performed for example by a thin film formation process such as a vacuum deposition process, a sputtering process and a plasma CVD process, as well as by a printing process such as a relief printing process, a gravure printing process, a screen printing process and an ink jet printing process. For example in a case where the semiconductor layer 30 is a silicon layer, an amorphous silicon-containing semiconductor layer 30 can be formed by applying a cyclic silane compound-containing solution (for example, cyclopentasilane-containing toluene solution) to the predetermined position on the insulating layer 20 with the ink jet printing process, followed by subjecting it to a heat treatment at about 300° C.

Subsequent to the formation of the semiconductor layer 30, the source and drain electrodes 40s,40d are formed on the insulating layer 20 such that the source and drain electrodes 40s,40d contact with the semiconductor layer 30 as shown in FIG. 6(e). Each of the formed source and drain electrodes may have the thickness of about 50 nm to about 5 µm, for example. The formation of the source and drain electrodes 40s,40d can be performed through an application of Ag paste by using of a printing process (e.g., a screen printing process, a gravure printing process, or an ink jet printing process).

After the formation of the source and drain electrodes 40s,40d, a flexible film layer 50 is formed so that the flexible film layer covers the semiconductor layer 30 and the source and drain electrodes 40,40d, as shown in FIG. 7(a). Specifically, a resin film in a semi-cured condition is prepared wherein an adhesive material may be applied to the laminating surface of the resin film, and thereafter the prepared resin film is laminated onto the supporting substrate on which the semiconductor structure portion is provided. The laminate thus formed is then subject to a tentative bonding. The condition for the tentative bonding can be selected depending on the kinds of the semi-cured resin film and the adhesive material. For example, in a case of the resin film composed of a polyimide film (thickness: about 12.5 µm) and an epoxy resin (thickness: about 10 µm) as the adhesive material applied to the laminating surface thereof, the resin film and the supporting substrate are laminated onto each other and the resulting laminate is subject to a tentative pressure bonding under the heating condition of about 60° C. and the pressure condition of about 3 MPa.

The thickness of the formed resin film 50 is for example in the range of about 4 µm to about 100 µm. The formation of the resin film 50 makes it possible to protect the semiconductor structure portion and also to safely perform a handling or conveying procedure in the subsequent steps such as the patterning treatment of the metal foil 10 and the like.

Subsequent to the formation of the flexible film layer 50, openings 50a,50b are formed in the flexible film layer 50, and thereafter an electrically-conductive material is supplied into the resulting openings to form the vias 60a,60b, as shown in FIGS. 7(b) and 7(c). The completion of the formation of the vias 60a,60b produces the semiconductor device precursor 100'.

The openings 50a,50b of the resin film layer can be formed by a laser processing. As a laser for the laser processing, a carbon dioxide laser, a YAG laser, an excimer laser or the like may be used. As for the laser condition, the energy density may be in the range of about 50 mJ/cm$^2$ to about 500 mJ/cm$^2$, for example.

The opening 50a used for the contact via can be formed by irradiating the resin film layer 50 with a laser so that a surface of a circuit electrode which is connected to the semiconductor structure portion is exposed. While on the other hand, the opening 50b used for the alignment marker can be formed by irradiating the resin film layer with the laser so that the upper surface of the insulating layer 20 is exposed. With regard to the laser irradiation, each size (diameter) of the openings 50a,50b can be controlled to a desired size by adjusting the diameter of the laser. In this respect, the opening size (diameter) formed by the laser irradiation may be in the range of about 5 µm to about 80 µm. For example, the diameter of the opening may be approximately 30 µm in its aperture plane. In the meanwhile, a desired beam diameter may be obtained not only by adjusting the diameter of the laser, but also by applying a mask to the laser beam.

Moreover, when the openings 50a,50b are formed by the laser processing, each of the openings can be formed in a tapered shape (namely, there can be formed so-called "earthenware mortar form" or "inverted conical form" of the opening). That is, it is capable of forming an angle between the wall surface of each of the openings 50a,50b and the top face of the resin film layer 50 to be an obtuse angle (i.e. larger than 90 degrees). For example, the taper angle "α" as shown in FIG. 7(b) can be in the range of about 110° to about 160°. Comparing with the case where the angle between the wall surface of each of the openings 50a,50b and the top face of the resin film layer 50 is the right angle (=90 degrees) (in this regard, the angle may generally become "about 90 degrees" if the opening is formed by the machining process such as drilling and the like), each of the tapered openings 50a,50b enables it to facilitate the filling process of the openings 50a,50b with the use of the electroconductive material.

The method for forming the openings 50a,50b is not limited to the laser processing. For example, a punching process or mechanical drilling process may also be adopted for the formation of the openings. Furthermore, a photolithography process may also be adopted to form the openings in a case where the film is made of a light-sensitive polymer or the like.

For forming each of the vias 60a,60b, an electrically-conductive part is formed within each of the openings 50a,50b. In a case where the electrically-conductive part is made from an electrically-conductive paste, such electrically-conductive paste may be supplied into the openings 50a,50b by a printing process for the purpose of forming the electrically-conductive part. More specifically, a print mask is disposed on a surface of the resin film 50, and thereafter the openings 50a,50b are filled with the electrically-conductive paste by means of a squeegee. The print mask is used for preventing a contamination of the surface of the resin film with the electrically-conductive paste, and thus the print mask is provided with holes formed therein, the holes corresponding to the openings of the resin film. As an example of the print mask, a screen plate may be used. Alternatively, a PET film mask obtained by the PET film preliminarily laminated onto the surface of the resin film may also be used. In this regard, the PET film is laminated onto the surface of the resin film, and thereafter the laser irradiation is performed with respect to the PET film. As a result, there can be obtained the PET film mask wherein the holes of the PET film and the openings of the resin film are in alignment with each other. The PET film mask in itself is finally removed after the filling of the electrically-conductive paste is completed.

Subsequent to the formation of the vias 60a,60b, a metal layer 15 is formed on the flexible film layer 50, as shown in FIG. 7(d). Specifically, it is preferred that a metal foil 15 is disposed on the resin film 50, and then a thermocompression bonding therebetween is performed. The condition of the thermocompression bonding may be suitably selected depending on the kinds of the semi-cured resin film and the adhesive material. For example in a case of the resin film composed of a polyimide film (thickness: about 12.5 µm) and an epoxy resin (thickness: about 10 µm) as the adhesive material applied to the laminating surface thereof, the metal foil 15 may be laminated onto the resin film 50 and thereafter the adhesive material may be subject to a substantial curing for about 1 hour under the condition of about 140° C. and about 5 MPa. In a case where the electrically-conductive part comprises Cu component, the metal layer 15 can be formed by a plating process, which is preferable in terms of the productivity since the thermocompression bonding of the laminated metal foil can be eliminated. In this regard, a Cu seed layer is firstly formed by performing an electroless copper plating, and subsequently the opening is filled with Cu material by performing an electrolytic copper plating. Just as an example, the electroless copper plating can be performed by immersing a sample into an electroless plating bath obtained by adding a formaldehyde as a reducing agent into a copper sulfate aqueous solution. The electrolytic plating can be performed by immersing the sample in a copper sulfate aqueous solution so that the sample is used as a cathode and the phosphorus-containing copper is used as an anode. A polyether compound, an organic sulfur compound and/or an amine compound can be added to the copper sulfate aqueous solution, and plating can be performed by applying an electric current of about 3 A/dm$^2$ (a resist layer may also be formed on the upper surface of the resin film such that holes of the resist layer is in alignment with the openings 50b of the resin film).

Subsequent to the formation of the metal layer 15 on the flexible film layer 50, a wiring 70 is formed from the metal layer 15. Specifically, as shown in FIG. 8(a), a photo-resist film 11 is formed on the metal layer 15. Subsequently, as shown in FIGS. 8(a) and 8(b), a photomask 12 is disposed on the photo-resist film 11. Subsequently, as shown in FIG. 8(b), the photo-resist film 11 is subjected to a light-exposure treatment through the photomask 12, and thereafter the developing treatment is performed to remove the unnecessary portions of the photo-resist film 11 (see FIG. 8(c)). The disposition of the photomask 12 is performed by superimposing the alignment marker 60b of the resin film and a corresponding pattern of the photomask 12 onto each other. The identification of the alignment marker of the resin film can be done for example by using a X-ray transmission image obtained by irradiating the semiconductor device precursor 100' with a X-ray wherein the X-ray irradiation is performed under the semiconductor device precursor 100' and thus the X-ray transmission image is obtained above the metal layer 15. In general, a lighter element (i.e., an element with a lower atomic number) makes it possible for the X-ray to well penetrate therethrough, while on the other hand a heavier element (i.e., an element with a higher atomic number) such as a metal makes it hard for the X-ray to penetrate therethrough. Therefore, when the X-ray having a sufficient intensity for penetrating the metal layer is used in the X-ray irradiation, there can be generated a distinct contrast between the metal conductive part (i.e., position of alignment marker) and the body of the resin film part, and thereby the alignment marker can be well identified.

After the light-exposure and developing treatments, the metal layer 15 with the partially removed photo-resist film 11' disposed thereon is subjected to an etching process, and thereby forming the wiring 70, pixel electrode 150 (which will be described below) and the like (FIG. 8(c) to FIG. 9) from the metal layer 15. The method of the etching can be suitably selected depending on the kind of the metal layer. For example in a case where the metal layer is comprised of a copper foil, the etching can be performed by immersing it into an aqueous solution of iron chloride. Alternatively, the etching can be performed by a dry etching process (e.g., RIE).

The partially removed photo-resist film 11' used upon the developing treatment can be formed by the use of a direct light-exposure (see FIG. 10), instead of the use of the photomask. As for the direct light-exposure, a desired position (pattern) of the photo-resist film is locally irradiated with the laser (e.g., laser with wavelength of 355 nm). That is, the photo-resist film is directly exposed to the light with no photomask disposed thereon. The position to be irradiated with the laser can be determined based on the identification of the alignment marker 60b. Such identification of the alignment marker 60b can be done similarly to that of the above use of the photomask. In other words, the direct light-exposure makes use of at least one of the vias of the semiconductor device precursor as an alignment marker in order to directly expose the desired position of the photo-resist film to the light without using the photomask.

In any of "light-exposure using photomask" and "direct light-exposure", it is preferred that a part of the metal layer is removed, the part being located above the alignment marker. The reason for this is that the alignment marker can be identified by using a visible light when a functional layer (e.g., image display layer) is aligned to be laminated onto the semiconductor device. Such alignment using the visible light is simple.

Figure 9:
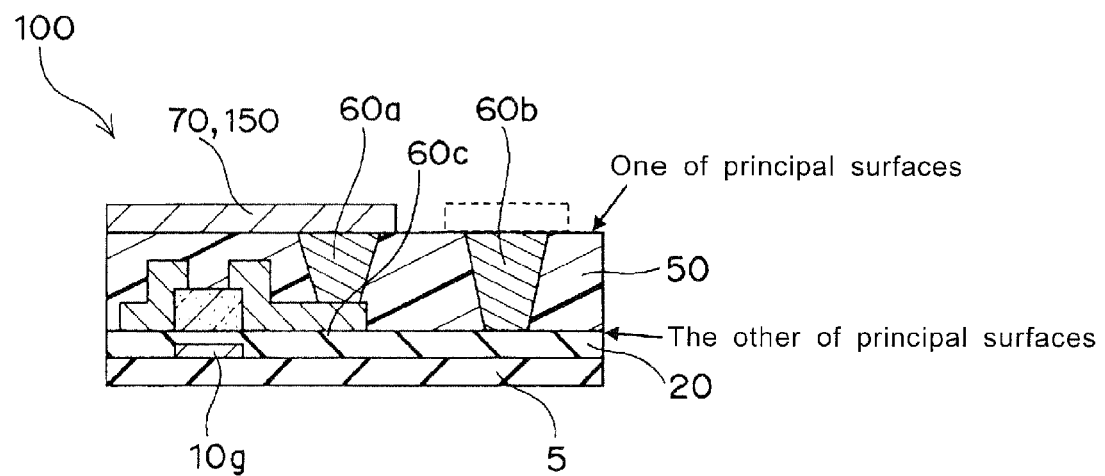
FIG. 9 is a cross sectional view schematically illustrating the step in a manufacturing process of a flexible semiconductor device according to an embodiment of the present invention.

Throughout the above-mentioned steps, there can be finally obtained the flexible semiconductor device 100 having the structure as shown in FIG. 9 and FIG. 1. As seen from the embodiment shown in Figures (especially FIG. 9), the wiring 70 and the pixel electrode 150 are made of a part of the metal layer 15. In the flexible film layer 50, a plurality of vias (60a, 60b, . . . ) are provided such that they extend in a thickness direction of the layer 50. The partially removed portion of the metal layer is provided at a position of at least one via (i.e., via 60b in FIG. 9). As for the embodiment shown in FIG. 9, a part of the metal layer, which part is in contact with the upper surface of the via 60b, has been removed (the removed portion is indicated by the dashed lines). Moreover, unlike the contact via 60a, the via 60b serving as the alignment marker extends from one of the principal surfaces of the flexible film layer 50 to the other of the principal surfaces of the flexible film layer 50 as shown in FIG. 9.

In the manufacturing method of the present invention, the openings 50a,50b of the resin film layer 50 are filled with the electrically-conductive material (e.g., metal material) to form the electrically-conductive parts therefrom. Accordingly, the formation of the contact via and the formation of the alignment marker can be performed substantially by the same step at a time. The alignment marker in the present invention can be well identified by using the X-ray transmission image, making it possible to manufacture the TFT with no misalignment regarding the dispositions of the wiring 70 and the pixel electrode 150. In other words, the present invention makes it possible to not only improve an efficiency of the manufacturing process but also improve the TFT performance by the alignment marker (i.e., the electrically-conductive part) provided in the resin film.

In the manufacturing method of the flexible semiconductor device according to the present invention, the gate electrode 10g can be provided by a part of the metal layer 10. This will be now described in detail. Firstly, instead of the supporting substrate 5 shown in FIG. 6(a), a metal foil 10 is used. For example, a copper foil may be used. As such metal foil 10, any of commercially available ones can be used. The metal foil 10 has a thickness preferably in the range of about 3 μm to about 100 μm, more preferably in the range of about 4 μm to about 20 μm, still more preferably in the range of about 8 μm to about 16 μm. On a surface of the metal foil 10, there is formed an insulating layer 20. The insulating layer 20 may be provided by the "anodic oxidation of valve metal" (especially in a case where the metal foil is made of a valve metal). However, it is possible to form the insulating layer 20 by performing other methods. For example, it can be formed by a sol gel process. With respect to the sol gel process, the insulating layer 20 can be formed by applying (for example, spin-coating) an organic-inorganic hybrid material wherein organic molecules are bonded to the siloxane backbone, followed by calcinating it at about 300° C. to about 600° C. The thickness of the insulating layer 20 is approximately in the range of 0.1 μm to about 1 μm, for example. The subsequent forming steps such as the formations of the semiconductor layer 30, the source and drain electrodes 40s, 40d, the flexible resin film 50 and the wiring 70 are similar to those described above. The substantial difference lies in the formation of the gate electrode by subjecting the metal foil 10 to a processing treatment. Specifically, as shown in FIG. 11, a photo-resist film 11 is formed on the metal foil at a position for the gate electrode to be formed. Preferably, as shown in FIG. 11(a), the photo-resist film 11 is formed on the approximate whole of the lower surface of the metal foil 10. Subsequently, as shown in FIG. 11(b), a photomask 12 is disposed underneath the photo-resist film 11. Subsequently, as shown in FIG. 11(c), the photo-resist film 11 is subjected to a light-exposure treatment through the photomask 12, and thereafter the developing treatment is performed to remove the unnecessary portions of the photo-resist film. The disposition of the photomask 12 is performed by superimposing the alignment marker 60b of the resin film and a corresponding pattern of the photomask 12 onto each other (see FIGS. 11(b) and 11(c)). The identification of the alignment marker of the resin film can be done for example by using a X-ray transmission image obtained by irradiating the semiconductor device precursor 100' with a X-ray wherein the X-ray irradiation is performed above the semiconductor device precursor 100' and thus the X-ray transmission image is obtained underneath the metal foil 10. In general, a lighter element (i.e., an element with a lower atomic number) makes it possible for the X-ray to well penetrate therethrough, while on the other hand a heavier element (i.e., an element with a higher atomic number) such as a metal makes it hard for the X-ray to penetrate therethrough. Therefore, when the X-ray having a sufficient intensity for penetrating the metal foil is used in the X-ray irradiation, there can be generated a distinct contrast between the metal conductive part (i.e., position of alignment marker) and the body of the resin film, and thereby the alignment marker can be well identified.

After the light-exposure and developing treatments, the metal foil 10 with the partially removed photo-resist film 11' disposed thereon is subjected to an etching process, and thereby forming the gate electrode 10g from the metal foil 10 (FIGS. 12(a) and 12(b)). The method of the etching is similar to that used for the above formation of the wiring 70. It should be noted that the etching process of the metal foil 10 may be concurrently performed with the etching process of the metal foil 15. In other words, the etching process of the metal foil 10 for forming the gate electrode 10g and the etching process of the metal foil 15 for forming the wiring 70 may be performed substantially by the same step at a time. Even in this embodiment where the gate electrode 10g is formed by the processing treatment of the metal foil 10, the direct light-exposure can be performed. That is, the local region of the photo-resist film can be exposed to the light by making use of the alignment marker 60b as a positioning reference (see FIG. 10).

(Alignment Marker and Alignment)

Now, the characterizing feature of the present invention, i.e., "alignment" and "alignment marker" will be described in detail. It is preferred in the present invention that the X-ray transmission image obtained by using the alignment marker is used upon the alignment of the photomask. Specifically, as shown in FIG. 13, it is preferred that the X-ray transmission image 110 obtained by irradiating the semiconductor device precursor 100' with the X-ray is used, in which case via-corresponding points 120 in the X-ray transmission image are used as a positioning reference. Namely, the image points which correspond to the positions of the vias are used as the positioning reference, such image points being obtained by irradiating the semiconductor device precursor 100' having the alignment markers 60b,60b' with the X-ray.

The alignment markers may be provided per light-exposure region. For example, a set of the alignment markers (e.g., two alignment markers or two units of the alignment markers) may be provided per photomask. In other words, the following matters can be conceivable:

When the photomask is disposed per one transistor, the alignment markers are disposed per such one transistor (FIG. 14(a)).

When the photomask is disposed per one group of a plurality of transistors, the alignment markers are disposed per such one group (FIG. 14(b)).

When all the transistors in the work are subjected to the light-exposure and developing treatments by using one photomask, a set of the alignment markers are disposed per such work (FIG. 14(c)).

The position of the alignment marker is not particularly limited. Take an embodiment where the alignment of the photomask is performed upon the disposing thereof as an example, the alignment markers may be disposed at the central region of the short side of the rectangular photomask. This makes it possible to minimalize the misalignment between the photomask and the work (i.e., a superimposition accuracy can be improved). For example, the two alignment markers are measured by using the X-ray transmission image as described above, and thereby a centroid of the alignment region is determined, and also the assigned dimensions and error are corrected. As a result, the alignment of the photomask can be suitably performed by considering the values designed from the above centroid.

According to the present invention, the single via can serve as the alignment marker. However, the unit of a plurality of the vias can also serve as the alignment marker, as shown in FIGS. 15(a) to 15(d). That is, the four alignment markers may be disposed such that the unit (i.e., group) of them forms a square. Alternatively, the five alignment markers may be disposed such that the unit (i.e., group) of them forms a cross-like figure. As such, a plurality of the alignment markers may be disposed so that the unit (i.e., group) of them is in a desired form as a whole. This makes it possible to more clearly distinguish the alignment markers from the contact via, which leads to a desired image recognition.

Upon the alignment of the photomask, not the X-ray, but a visible light ray may be used. Specifically, as shown in FIG. 16, in a case where the metal layer 15 and the photo-resist film 11 are partially removed at upper positions of the alignment markers 60b (see FIGS. 16(a) and 16(b)), the positions of the alignment markers 60b can be identified when illuminating the upper side of the device precursor by means of the visible light. Accordingly, by making use of the markers 60b as a positioning reference, the alignment of the photomask (see FIG. 16(c)) and the alignment of the direct light-exposure can be suitably performed.

《Image Display Device》

Next, an embodiment wherein the flexible semiconductor device 100 of the present invention is utilized in an image display device will be described.

(2Tr1C)

Figure 17:
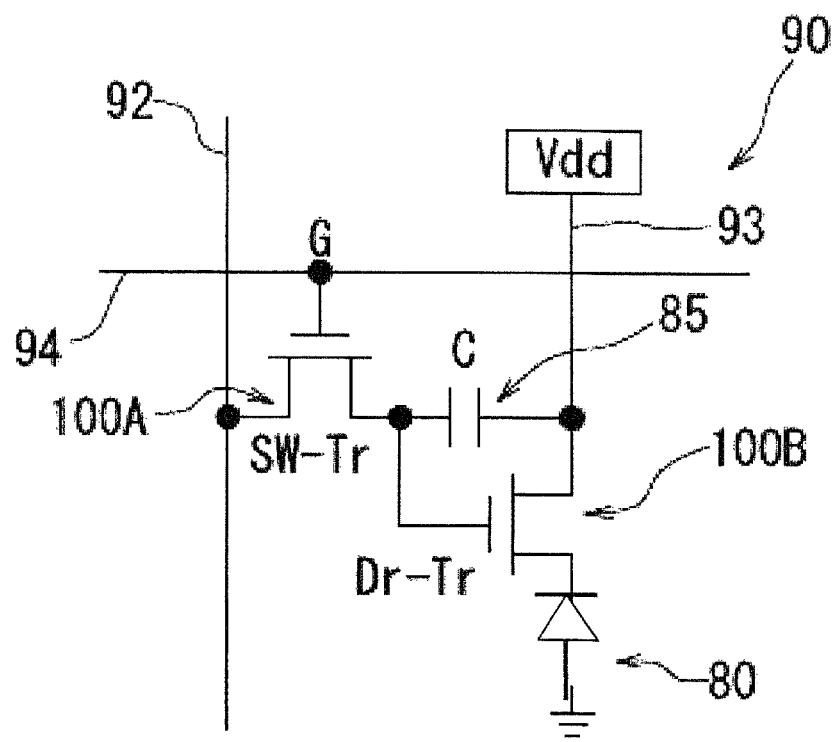
FIG. 17 is a circuit diagram showing a drive circuit of an image display device according to an embodiment of the present invention.

FIG. 17 is a circuit diagram for explaining a drive circuit 90 of the image display device. FIG. 18 is a plan view of an example wherein the drive circuit is constructed by using the flexible semiconductor device 100 according to an embodiment of the present invention.

The circuit 90 shown in FIG. 17 is a driving circuit which is mounted on an image display device (e.g., organic electroluminescence display), and FIG. 17 shows a constitution of one pixel in the image display device. Each pixel in the image display device according to the present invention comprises a circuit with a combination of two transistors (100A, 100B) and one capacitor 85. This driving circuit includes a switching transistor 100A (hereinafter, referred to as "Sw-Tr") and a driving transistor 100B (hereinafter, referred to as "Dr-Tr"), both of which consist of the flexible semiconductor device 100 of the present invention. It is possible that the structure of the flexible semiconductor device 100 is provided with a capacitor. More specifically, a gate electrode of Sw-Tr 100A is connected to a selection line 94. As for the source electrode and the drain electrode of Sw-Tr 100A, one thereof is connected to a data line 92 and the other thereof is connected to a gate electrode of Dr-Tr 100B. As for the source electrode and the drain electrode of Dr-Tr 100B, one thereof is connected to a power line 93 and the other thereof is connected to a display area 80 (e.g., an organic electroluminescence element). The capacitor 85 is connected to the region between the source electrode and the gate electrode of Dr-Tr 100B.

As for the above pixel circuit, when the switch of Sw-Tr 100A is set "ON" during the activation of the selection line 94, a driving voltage is supplied from data line 92 and then selected by Sw-Tr 100A, and thereby a voltage is applied to the gate electrode of Dr-Tr 100B. The drain current corresponding to the voltage is supplied to the display 80, thereby the display (organic EL device) 80 is caused to emit light. When the voltage is applied to the gate electrode of Dr-Tr 100B, electric charge is stored in the capacitor 85. This charge plays the role (retention volume) which continues the applying of the voltage to the gate electrode of Dr-Tr 100B over fixed time, even after the selection by Sw-Tr 100A is canceled.

FIG. 18 is a plan view of the flexible semiconductor device in which a part of the circuit 90 shown in FIG. 17 is formed. FIG. 18(a) is a plan view seen from the upper surface of the resin film. FIG. 18(b) is a plan view wherein the metal layer and the resin film disposed on the resin film have been eliminated. FIG. 18(c) is a plan view wherein the semiconductor structure portion and the electrically-conductive part as well as the insulating layer disposed on the supporting substrate have been further eliminated.

As shown in the circuit 90 in FIG. 17, the capacitor 85 which stores capacity is required in the drive circuit capable of driving an image display device. In the construction shown in FIG. 18, the capacitor is built in a part of the substrate structure, thus it is not necessary to arrange a capacitor separately to the exterior of the substrate structure. Therefore, it is possible to provide an image display device having a small size and high density mounting efficiency.

(Lamination of Image Display Device)

Next, an embodiment where the image display unit is produced by the transistor or a circuit comprising the transistors (particularly, an embodiment about the image display unit composed of a plurality of pixels over the flexible semiconductor device) will be explained.

Figure 19:
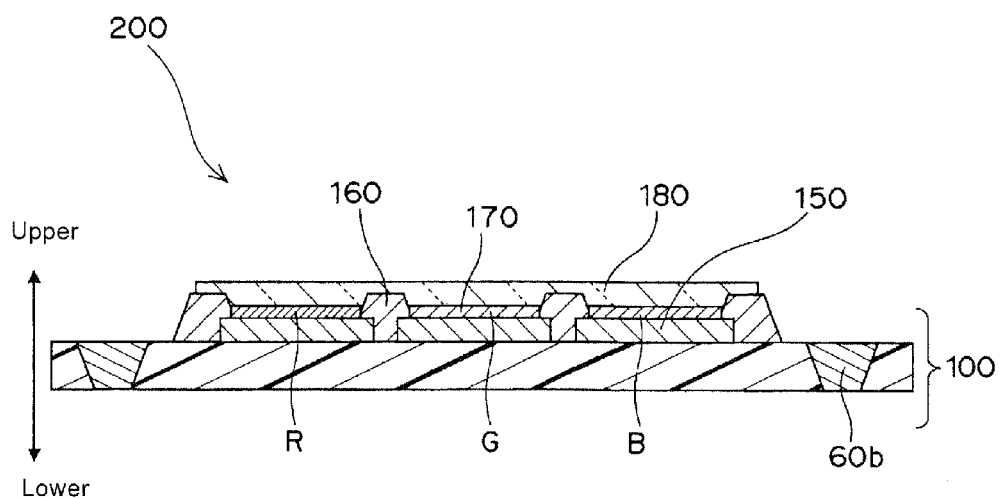
FIG. 19 is a cross sectional view schematically illustrating an image display device according to an embodiment of the present invention.

FIG. 19 is a sectional view of an OLED (organic electroluminescence) image display device 200 wherein three colors consisting of R (red), G (green) and B (blue) are used in three pixels on the flexible semiconductor device of the present invention. The semiconductor device is illustrated only by a resin film, pixel electrodes (cathodes) and the alignment markers. In such image display device 200, each light emitting layer 170 is arranged on each pixel electrode 150 consisting of R, G and B pixels where the luminescent materials of the light emitting layers respectively correspond to the respective ones of R, G and B. Pixel regulating parts 160 are provided between the adjacent pixels to prevent the adjacent luminescent materials from being intermingled with each other as well as to facilitate the positioning upon the supply of the EL materials. A transparent electrode layer (anode layer) 180 is provided over the light emitting layer 170 such that it covers the whole of each pixel.

Examples of the materials to be used for the pixel electrodes 150 include a metal (e.g., Cu). The pixel electrode may have a stacked layer structure composed of a charge injection layer and a surface layer (e.g., Al surface layer with its thickness of 0.1 µm) wherein the charge injection layer functions to improve a charge injection efficiency with respect to the light emitting layer 170, and the surface layer functions to improve a light extraction efficiency in upward direction by reflecting a light emitted from the light emitting layer. In this regard, the pixel electrode may be a reflection electrode with Al/Cu stacked layer structure, for example.

Examples of the material to be used for the light emitting layer 170 include, but not limited to, a polyfluorene-based electroluminescent material and a dendrimer-based light emitting material having a dendritically branched structure wherein at least one heavy metal (e.g., Ir or Pt) is positioned at the center of a dendron backbone of a so-called dendrimer. The light emitting layer 170 may have a single layer structure. Alternatively, the light emitting layer 170 may have a stacked layer structure with an electron injection layer/a light emitting layer/a hole injection layer wherein $MoO_3$ is used for the hole injection layer (to facilitate the injection of charge) and LiF is used for the electron injection layer. As the transparent electrode 180 of the anode, ITO may be used.

As for the pixel regulating part 160, it may be made of an insulating material. For example, a photosensitive resin mainly comprising polyimide, or SiN can be used as the insulating material of the pixel regulating part 160.

Figure 20:
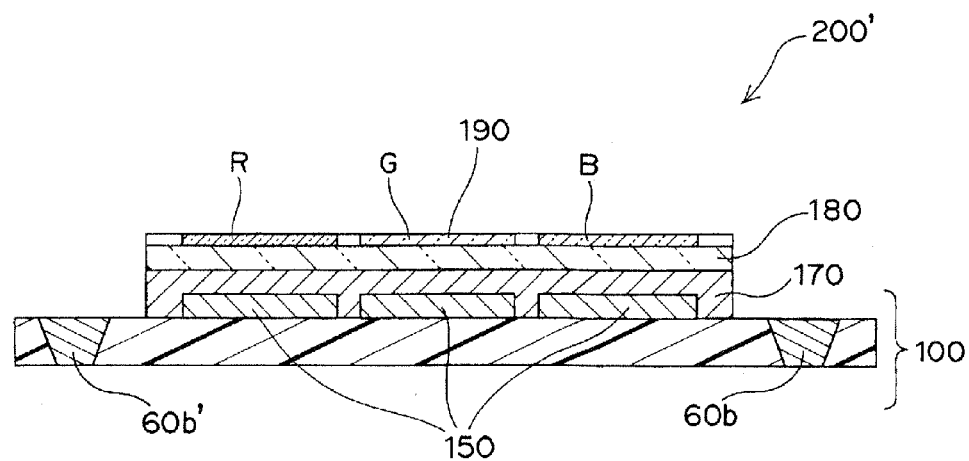
FIG. 20 is a cross sectional view schematically illustrating an image display device equipped with a color filter.

The image display device may be configured to have a structure with a color filter as shown in FIG. 20. The image display device 200' as shown in FIG. 20 comprises the flexible semiconductor device 100, a plurality of pixel electrodes 150 provided on the flexible semiconductor device 100, a light emitting layer 170 provided such that it wholly covers the pixel electrodes 150, a transparent electrode layer 180 provided on the light emitting layer 170, and a color filter 190 provided on the transparent electrode layer 180. In the image display device 200', the color filter 190 has a function to convert lights emitted from the light emitting layer 170 to three kinds of lights of red, green and blue, and thereby three kinds of pixels consisting of R (red), G (green) and B (blue) are provided. As for the image display device 200 shown in FIG. 19, each of the light emitting layers separated by the pixel regulating parts 160 emits each of red, green and blue lights separately. While on the other hand, as for the image display device 200' shown in FIG. 20, the light emitted from the light emitting layer has no difference in color (i.e., the light emitting layer emits white light), but the passing of the light through the color filter 190 causes the generation of each of red, green and blue lights.

(Manufacturing Method of Image Display Device)

Figure 21:
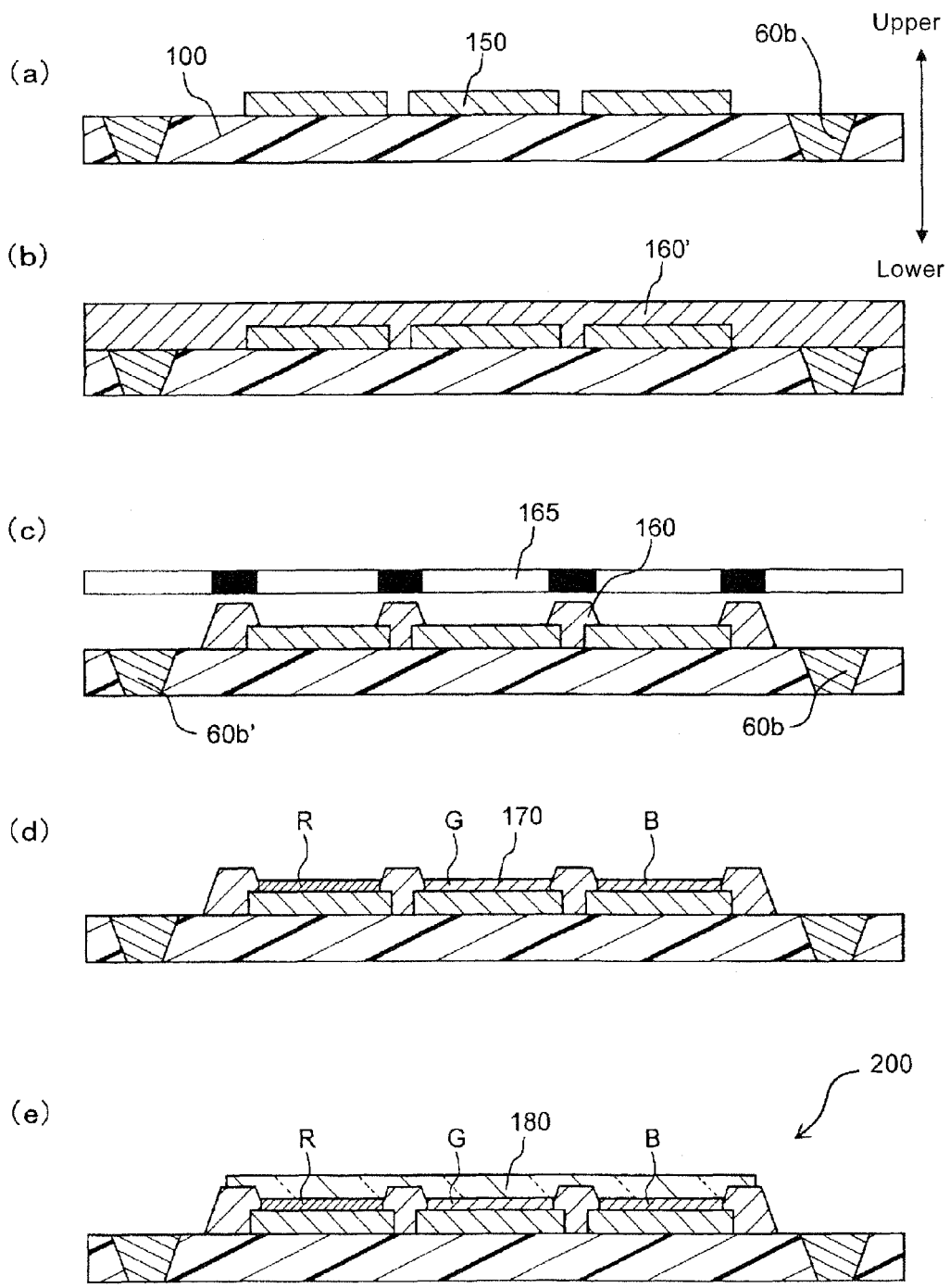
FIGS. 21(a) to 21(e) are cross sectional views schematically illustrating the steps in a manufacturing process of an image display device according to the present invention.

Next, a manufacturing method of the image display device will be explained. Specifically, a manufacturing method of OLED according to the present embodiment will be explained with reference to FIG. 21.

First, the step (I) is performed. That is, the flexible semiconductor device 100 equipped with pixel electrodes 150 is prepared as shown in FIG. 21(a). Specifically, by performing the manufacturing method of the flexible semiconductor device according to the present invention, the flexible semiconductor device 100 with the pixel electrodes 150 and the wiring 70 formed on the upper face thereof is prepared.

Subsequently, the step (II) is performed. That is, an image display unit composed of a plurality of pixels is formed over the flexible semiconductor device. For example, as shown in FIGS. 21(b) to 21(d), a plurality of pixel regulating parts 160 are formed on the flexible semiconductor device 100, and then each light emitting layer 170 is formed on a region of each pixel electrode 150, the region being partitioned by the pixel regulating parts 160. The pixel regulating parts 160 can be formed, for example, by forming a precursor layer 160' for the pixel regulating parts wherein the pixel electrodes as a whole are covered with a photosensitive resin material mainly consisting of polyimide, followed by subjecting the precursor layer 160' to a photolithography process. Light emitting layers 170 of the predetermined colors are respectively formed on the corresponding ones of the pixel electrodes. The light emitting layers 170 can be formed, for example, by applying a solution of a polyfluorene-based electroluminescent material (1%) dissolved into xylene onto the pixel electrodes by performing an ink jet process. The light emitting layer 170 may have a thickness of about 80 nm, for example. Upon the photolithography process of the precursor layer 160' of the pixel regulating parts and/or upon the ink jet application of the light emitting material for the formation of the light emitting layer 170, the alignment markers 60b,60b' of the flexible semiconductor device are preferably used. This is because the use of the alignment markers 60b,60b' can effectively prevent a cumulative risk of the misalignment regarding the constituent elements of the image display device. In this regard, it is preferred that a partially removed portion of the metal foil is provided, the removed portion being provided on the alignment marker. Such partial removal of the metal foil enables the alignment marker to be identified by means of the visible light ray. The partial removal of the metal foil disposed on the alignment marker can be performed together with the patterning process of the metal layer 15, and thus the number of the processes is not substantially increased by such removal.

Subsequent to the formation of the light emitting layer 170, a transparent electroconductive layer 180 (e.g., ITO film) is formed so as to cover the light emitting layers 170. The transparent electroconductive layer consisting of the ITO film can be formed by performing a sputtering process.

Through the above processes, there can be finally obtained the image display device 200 having the structures as shown in FIG. 21(e) and FIG. 20.

As an alternative embodiment, the manufacturing process of the image display device 200' equipped with a color filter will now be explained. This manufacturing process is substantially the same as that of the above mentioned manufacturing process, while there are some partial differences. Specifically, after the step (I) as mentioned above (see, FIG. 22(a)), a light emitting layer 170 capable of emitting white color is wholly laminated in the form of a film (see FIG. 22(b)). Subsequently, a transparent electrode layer 180 is formed in the same manner as mentioned above (see FIG. 22(c)). Thereafter, the color filter 190 capable of emitting R (red), G (green) and B (blue) is formed such that each color of the filter is arranged at each of the corresponding pixel positions (see FIG. 22(d)). As a result of the above processes, there can be finally obtained the image display device 200'. Upon the arrangement of the color filter 190, the alignment markers 60b,60b' of the flexible semiconductor device can be used. The use of the alignment markers 60b,60b' can effectively prevent a cumulative risk of the misalignment regarding the constituent elements of the image display device. In this regard, the removal of a part of the metal foil is preferred, the part being provided on the alignment marker. This is because such removal enables the alignment marker to be identified by means of the visible light ray. The partial removal of the metal foil disposed on the alignment marker can be performed together with the patterning process of the metal foil, and thus the number of the processes is not substantially increased by such removal.

Although a few embodiments of the present invention have been hereinbefore described, the present invention is not limited to these embodiments. It will be readily appreciated by those skilled in the art that various modifications are possible without departing from the scope of the present invention. For example, the following modified embodiments are possible.

Instead of the embodiment where the contact via and the alignment marker are individually provided, another embodiment may be possible where a part of the contact vias is the alignment marker(s).

Instead of the embodiment where the alignment marker has a form of "via", another embodiment may be possible where the alignment marker has a form of "through-hole" in which metal film (e.g., copper film) may be provided on an innerwall surface of the opening by a non-electrolytic plating.

The present invention is not particularly limited to the embodiment where the resin film is laminated to form the flexible film layer of the flexible semiconductor device. Another embodiment may be possible where the formation of the flexible film layer is performed through an application (e.g., spin coating) of a semi-cured resin material or a photosensitive resin material.

Each pixel may comprise not only two TFT elements (the first TFT element and the second TFT element) but also more than two elements depending on the constructional design of the display. As a result, the flexible semiconductor device of the present embodiment may be modified according to such constructional design.

In each of the above embodiments, although the present invention has been described with respect to the flexible semiconductor device which is mounted on an organic EL display, the flexible semiconductor device of the present invention may be mounted on an inorganic EL display. Moreover, the flexible semiconductor device may be mounted not only on the EL display but also on an electronic paper. Furthermore, it is possible that the flexible semiconductor device of the present invention is mounted not only on the display device but also on communication facilities (e.g., RFID), memories and so on.

The several embodiments wherein each one flexible semiconductor device is manufactured in the form corresponding to one device have been described above. While not being limited thereto, the present invention can be performed such that the flexible semiconductor devices are manufactured in the form corresponding to two or more devices. As an example of such manufacturing form, a roll-to-roll process may be adopted.

INDUSTRIAL APPLICABILITY

Figure 23:
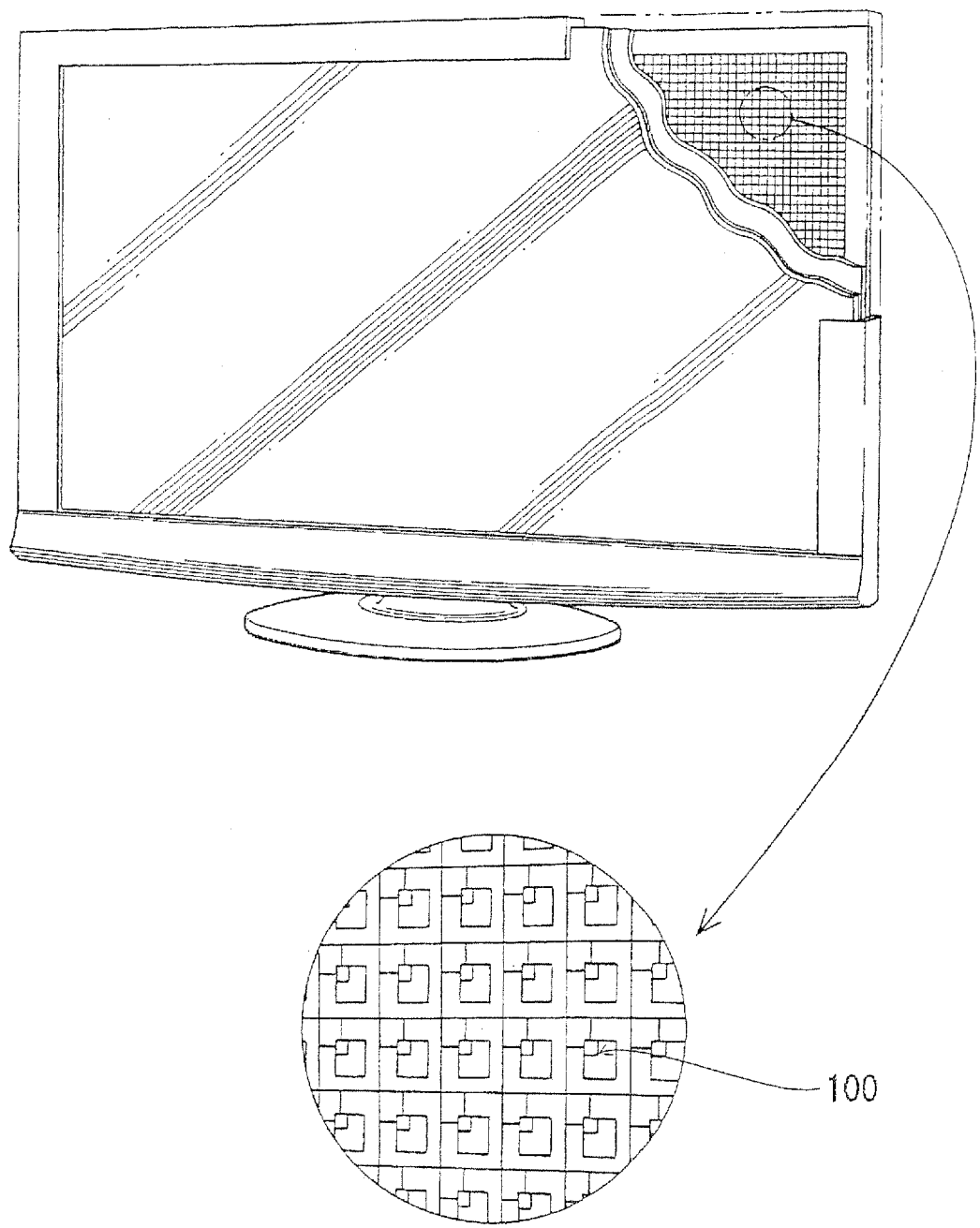
FIG. 23 is a schematic view illustrating an example of a product (an image display part of a television) wherein the flexible semiconductor device is used.
Figure 24:
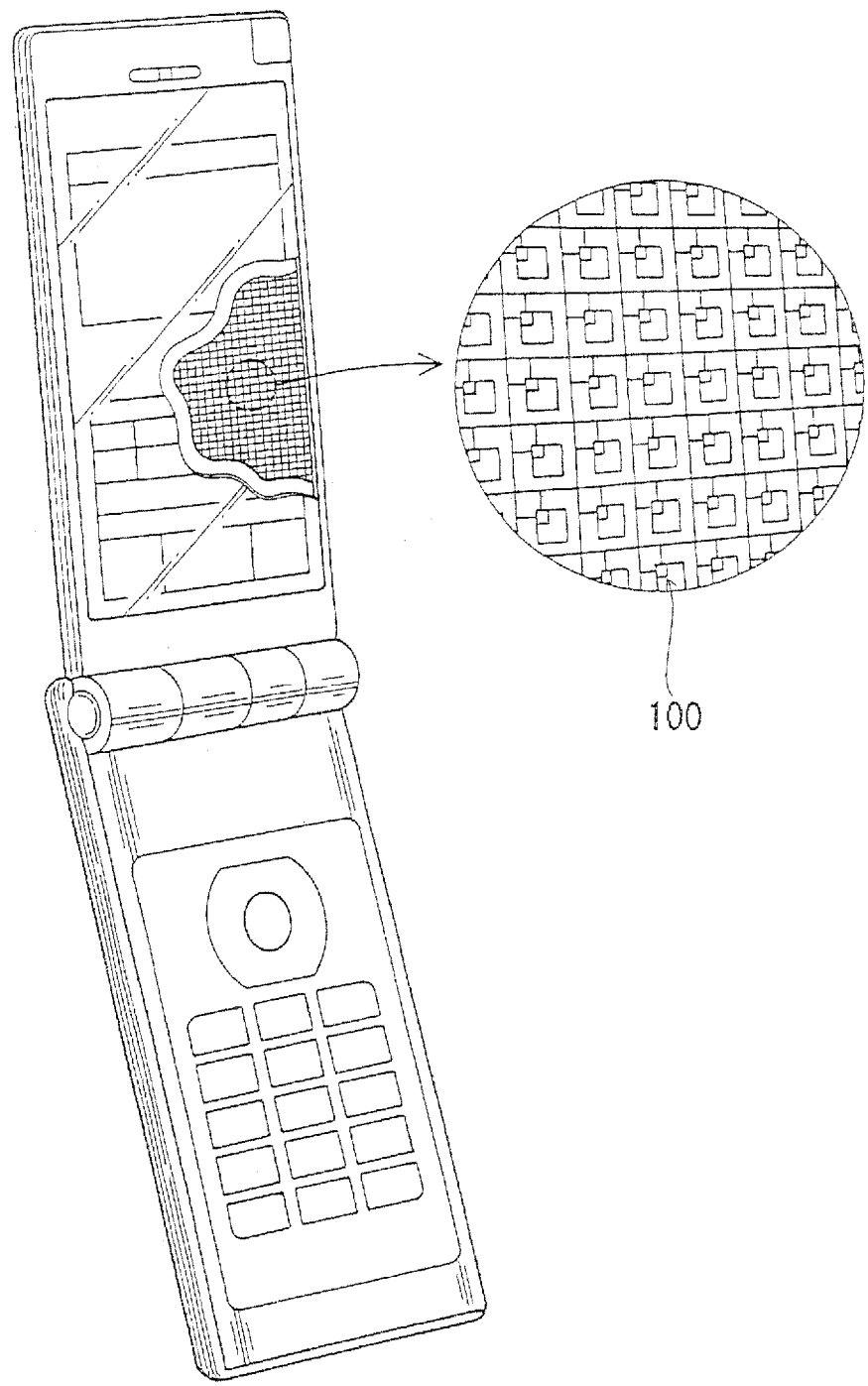
FIG. 24 is a schematic view illustrating an example of a product (an image display section of a cellular phone) wherein the flexible semiconductor device of the present invention is used.
Figure 25:
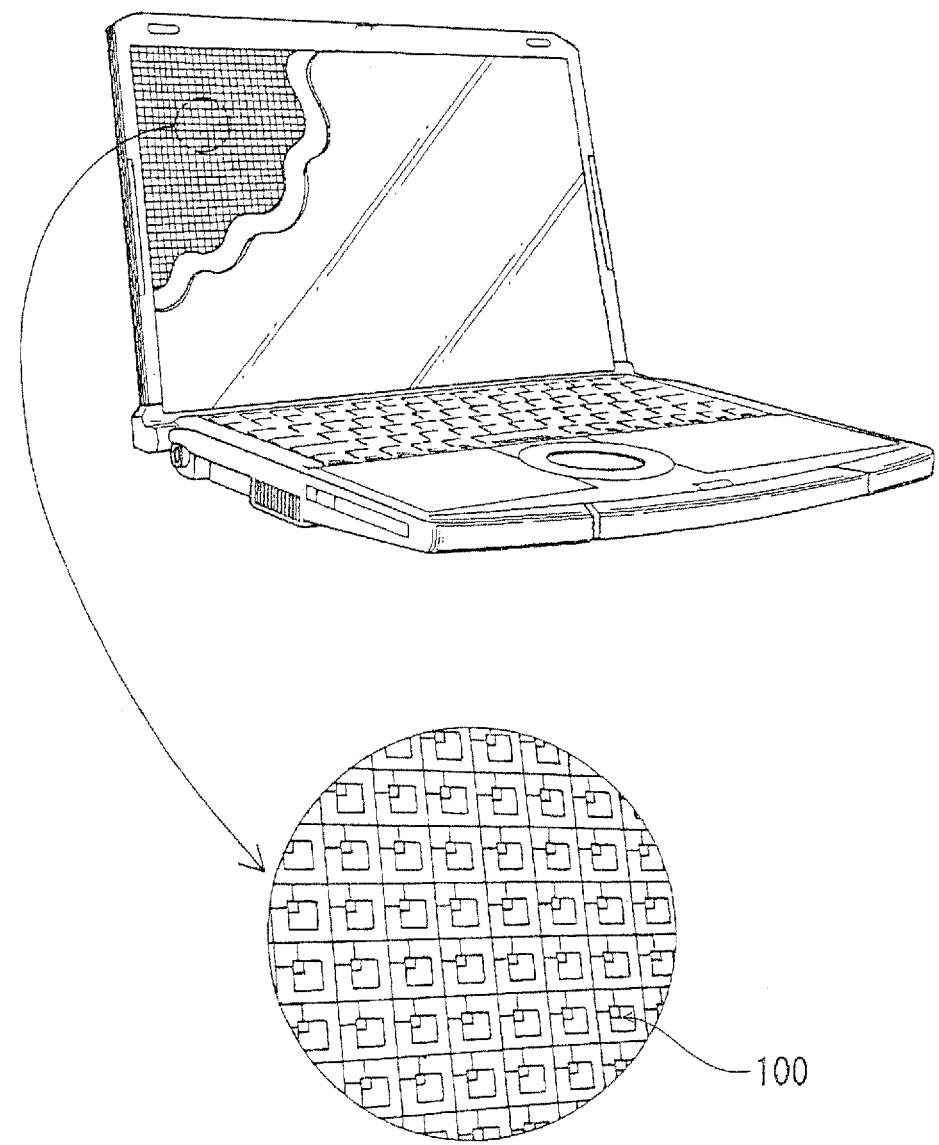
FIG. 25 is a schematic view illustrating an example of a product (an image display section of a mobile personal computer or a laptop computer) wherein the flexible semiconductor device of the present invention is used.
Figure 26:
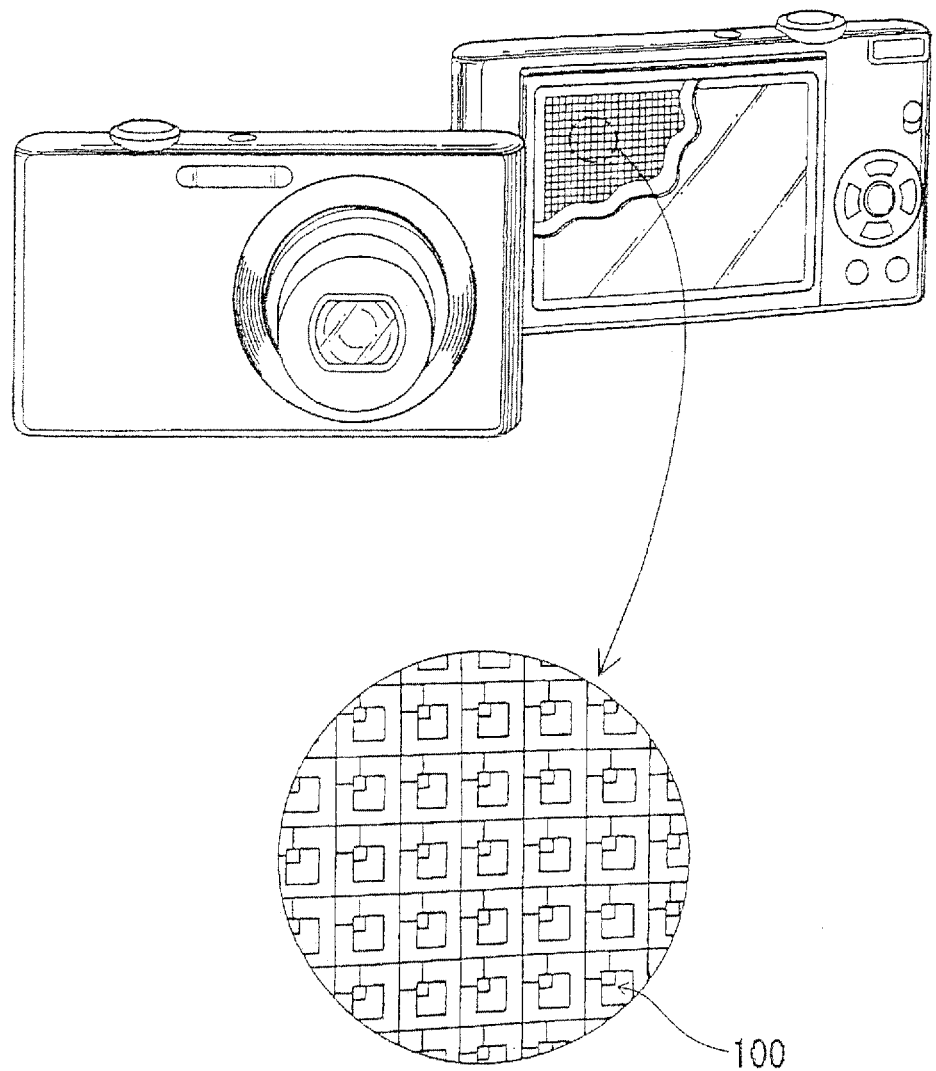
FIG. 26 is a schematic view illustrating an example of a product (an image display section of a digital still camera) wherein the flexible semiconductor device of the present invention is used.
Figure 27:
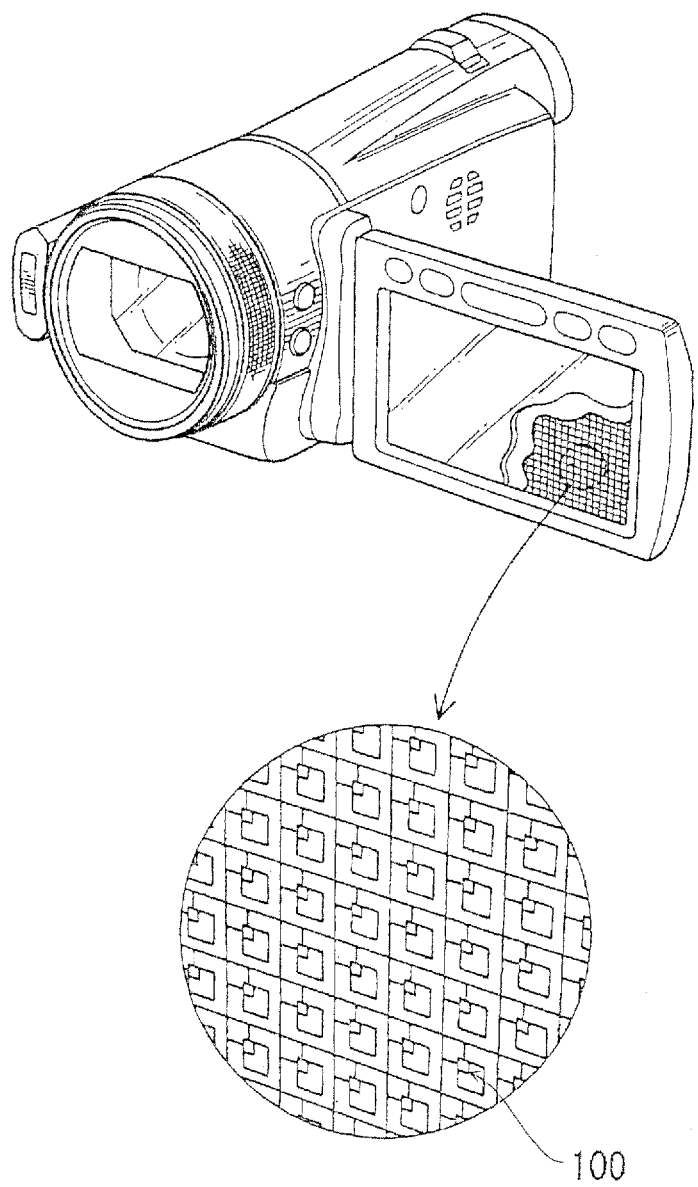
FIG. 27 is a schematic view illustrating an example of a product (an image display section of a camcorder) wherein the flexible semiconductor device of the present invention is used.
Figure 28:
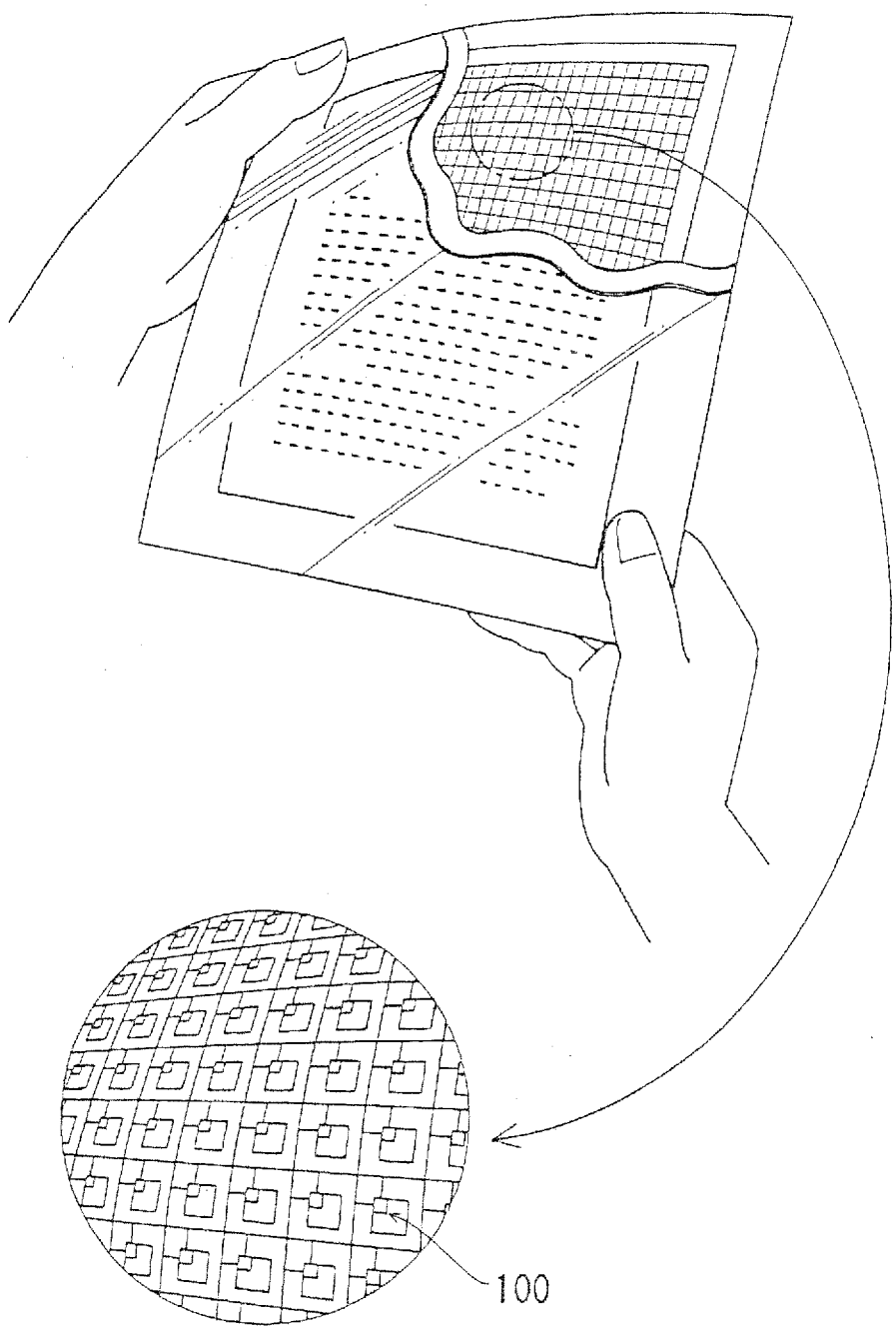
FIG. 28 is a schematic view illustrating an example of a product (an image display section of an electronic paper) wherein the flexible semiconductor device of the present invention is used.

The manufacturing method of the flexible semiconductor device of the present invention is excellent in the productivity of a flexible semiconductor device. The resulting flexible semiconductor device can also be used for various image display parts (i.e., image display device), and also can be used for an electronic paper, a digital paper and so forth. For example, the flexible semiconductor device can be used for a television picture indicator as shown in FIG. 23, the image display part of a cellular phone as shown in FIG. 24, the image display part of a mobile personal computer or a notebook computer as shown in FIG. 25, the image display part of a digital still camera and a camcorder as shown in FIGS. 26 and 27, the image display part of an electronic paper as shown in FIG. 28 and so forth. The flexible semiconductor device obtained by the manufacturing method of the present invention can also be adapted for the various uses (for example, RF-ID, a memory, MPU, a solar battery, a sensor and so forth) which application is now considered to be adapted by the printing electronics.

CROSS REFERENCE TO RELATED PATENT APPLICATION

The present application claims the right of priority of Japan patent application No. 2011-66143 (filing date: Mar. 24, 2011, title of the invention: FLEXIBLE SEMICONDUCTOR DEVICE, METHOD FOR MANUFACTURING THE SAME, IMAGE DISPLAY DEVICE USING THE SAME AND METHOD FOR MANUFACTURING THE IMAGE DISPLAY DEVICE), the whole contents of which are incorporated herein by reference.

The invention claimed is:

1. A method for manufacturing a flexible semiconductor device, comprising the steps of:
    forming a gate electrode;
    forming a gate insulating film so that the gate insulating film contacts with the gate electrode;
    forming a semiconductor layer on the gate insulating film such that the semiconductor layer is opposed to the gate electrode;
    forming source and drain electrodes so that the source and drain electrodes contact with the semiconductor layer;
    forming a flexible film layer so that the flexible film layer covers the semiconductor layer and the source and drain electrodes;
    forming vias in the flexible film layer;
    forming a first metal layer by disposing a metal foil onto the flexible film layer, and thereby a semiconductor device precursor is provided; and
    subjecting the first metal layer to a processing treatment to form a wiring from a part of the first metal layer,
    wherein, in the step of the processing treatment of the first metal layer, the wiring is formed in a predetermined position by using at least one of the vias as an alignment marker.

2. The method according to claim 1, further comprising the step of providing another metal foil used for the formation of the gate electrode to form a second metal layer, and then forming an insulating layer serving as the gate insulating film on one of principal surfaces of the second metal layer,
    wherein the second metal layer is subjected to a processing treatment to form the gate electrode from a part of the second metal layer, whereas the first metal layer is subjected to the processing treatment to form the wiring from the part of the first metal layer.

3. The method according to claim 1, wherein the forming step of the wiring from the part of the first metal layer comprises sub-steps of:
    forming a photo-resist film on the first metal layer;
    subjecting the photo-resist film to a light-exposure treatment and a developing treatment, and thereby removing at least part of the photo-resist film; and
    subjecting the first metal layer to an etching treatment via the photo-resist film at least part of which has been removed, and thereby forming the wiring from the first metal layer,
    wherein, in the step of the light-exposure treatment of the photo-resist film, a predetermined position of the photo-resist film is exposed to the light by using the at least one of the vias of the semiconductor device precursor as the alignment marker.

4. The method according to claim 3, wherein the forming step of the gate electrode from the part of the second metal layer comprises sub-steps of:
    forming a photo-resist film on the other of the principal surfaces of the second metal layer;
    subjecting the photo-resist film to a light-exposure treatment and a developing treatment, and thereby removing at least part of the photo-resist film; and
    subjecting the second metal layer to an etching treatment via the photo-resist film at least part of which has been removed, and thereby forming the gate electrode from the second metal layer,
    wherein the etching treatment of the first metal layer and the etching treatment of the second metal layer are performed in the same etching process.

5. The method according to claim 3, wherein, as the light-exposure and developing treatments of the photo resist film to remove the at least part of the photo-resist film, a photomask is disposed on the photo-resist film, and thereafter the photo-resist film with the photomask disposed thereon is subjected to the light-exposure and developing treatments to remove the at least part of the photo-resist film, and
    instead of using the alignment marker when subjecting the photo-resist film to the light-exposure treatment, an alignment of the photomask is performed upon the disposing thereof by using the at least one of the vias of the semiconductor device precursor as the alignment marker.

6. The method according to claim 1, wherein, in the step of forming the via, an opening is formed in the flexible film layer, and thereafter an electrically-conductive material with a metal contained therein is supplied into the opening to form the via.

7. The method according to claim 1, wherein, upon the processing treatment of the metal layer, the light-exposure treatment of the photo-resist film or the disposing of the photomask, a X-ray transmission image obtained by irradiating the semiconductor device precursor with a X-ray is used wherein a via-corresponding point in the X-ray transmission image is used as a positioning reference.

8. The method according to claim 7, wherein, at least two of the vias are used as a unit which constitutes the alignment marker; and
    the via-corresponding points in the X-ray transmission image, which correspond to the vias of the unit, are used as the positioning reference.

9. A flexible semiconductor device comprising:
    a gate electrode;
    a gate insulating film disposed on the gate electrode;
    a semiconductor layer disposed on the gate insulating film, the semiconductor layer being opposed to the gate electrode;
    source and drain electrodes which are in contact with the semiconductor layer;

a flexible film layer disposed such that the semiconductor layer and the source and drain electrodes are covered with the flexible film layer; and a first metal foil provided on the flexible film layer, wherein a wiring is made of a part of the first metal foil, and wherein the flexible film layer is provided with a plurality of vias extending in a thickness direction thereof, at least one of the vias being an alignment marker.

10. The flexible semiconductor device according to claim 9, further comprises:

a second metal foil provided below the semiconductor layer; and an insulating layer provided on the second metal foil, wherein the gate electrode is made of a part of the second metal foil, and the gate insulating film is made of a part of the insulating layer.

11. The flexible semiconductor device according to claim 9, wherein the alignment marker is provided as a unit of at least two of the vias.

12. A flexible semiconductor device comprising:

a gate electrode;

a gate insulating film disposed on the gate electrode;

a semiconductor layer disposed on the gate insulating film, the semiconductor layer being opposed to the gate electrode;

source and drain electrodes which are in contact with the semiconductor layer;

a flexible film layer disposed such that the semiconductor layer and the source and drain electrodes are covered with the flexible film layer; and a first metal foil provided on the flexible film layer, wherein a wiring is made of a part of the first metal foil, and wherein the flexible film layer is provided with a plurality of vias extending in a thickness direction thereof, and a partially removed portion of the first metal foil is provided at a position of at least one of the vias.

13. The flexible semiconductor device according to claim 12, further comprises:

a second metal foil provided below the semiconductor layer; and an insulating layer provided on the second metal foil, wherein the gate electrode is made of a part of the second metal foil, and the gate insulating film is made of a part of the insulating layer.

14. The flexible semiconductor device according to claim 9, wherein the at least one of the vias is an electrically-conductive part which comprises a metal.

15. The flexible semiconductor device according to claim 9, wherein the at least one of the vias has a taper shape in a thickness direction thereof.

16. The flexible semiconductor device according to claim 9, wherein the at least one of the vias extends from one of the principal surfaces of the flexible film layer to the other of the principal surfaces thereof.

17. The flexible semiconductor device according to claim 9, wherein not only the wiring is made of the part of the first metal foil, but also a pixel electrode is made of a part of the first metal foil.

18. A flexible semiconductor device comprising:

a gate electrode;

a gate insulating film disposed on the gate electrode;

a semiconductor layer disposed on the gate insulating film, the semiconductor layer being opposed to the gate electrode;

source and drain electrodes which are in contact with the semiconductor layer;

a flexible film layer disposed such that the semiconductor layer and the source and drain electrodes are covered with the flexible film layer; and a first metal layer provided on the flexible film layer, wherein a wiring is made of a part of the first metal layer, and wherein the flexible film layer is provided with a plurality of vias extending in a thickness direction thereof, and at least one of the vias being an alignment marker.

19. A flexible semiconductor device comprising:

a gate electrode;

a gate insulating film disposed on the gate electrode;

a semiconductor layer disposed on the gate insulating film, the semiconductor layer being opposed to the gate electrode;

source and drain electrodes which are in contact with the semiconductor layer;

a flexible film layer disposed such that the semiconductor layer and the source and drain electrodes are covered with the flexible film layer; and a first metal layer provided on the flexible film layer, wherein a wiring is made of a part of the first metal layer, and wherein the flexible film layer is provided with a plurality of vias extending in a thickness direction thereof, and a partial removed portion of the first metal layer is provided at a position of at least one of the vias.

20. An image display device using the flexible semiconductor device according to claim 9, the image display device comprising:

the flexible semiconductor device; and an image display unit composed of a plurality of pixels, the unit being provided over the flexible semiconductor device, wherein at least one of the vias provided in the flexible semiconductor device is an alignment marker.

21. The image display device according to claim 20, wherein the image display unit comprises:

a pixel electrode provided on the flexible semiconductor device;

a light emitting layer provided over the pixel electrode; and a transparent electrode layer provided on the light emitting layer.

22. The image display device according to claim 21, wherein the light emitting layer is provided at a region partitioned by a pixel regulating part.

23. The image display device according to claim 21, wherein a color filter is provided on the transparent electrode layer.

24. A method for manufacturing an image display device using the flexible semiconductor device according to claim 9, the method comprising the steps of:

(I) providing the flexible semiconductor device equipped with a pixel electrode; and (II) forming an image display unit composed of a plurality of pixels over the flexible semiconductor device, wherein, in the step (II), an alignment of the image display unit is performed upon the formation thereof by using at least one of the vias of the flexible semiconductor device as an alignment marker.

25. The method according to claim 24, wherein, in the step (II), a plurality of pixel regulating parts are formed, and then the pixels are formed on regions of the pixel electrode, the regions being partitioned by the pixel regulating parts, and wherein, in the step (II), an alignment of the pixel regulating parts is performed upon the formation thereof by using at least one of the vias of the flexible semiconductor device as the alignment marker.

26. The method according to claim 24, wherein, in the step (II), a light emitting layer is formed over the pixel electrode such that the light emitting layer covers the pixel electrode, and then a color filter is formed on the light emitting layer, and wherein, in the step (II), an alignment of the color filter is performed upon the formation thereof by using at least one of the vias of the flexible semiconductor device as the alignment marker.

* * * * *